(12) United States Patent
Ueda et al.

(10) Patent No.: US 12,309,908 B2
(45) Date of Patent: May 20, 2025

(54) EXTREME ULTRAVIOLET LIGHT GENERATION APPARATUS AND ELECTRONIC DEVICE MANUFACTURING METHOD

(71) Applicant: Gigaphoton Inc., Tochigi (JP)

(72) Inventors: Atsushi Ueda, Oyama (JP); Koichiro Koge, Oyama (JP)

(73) Assignee: Gigaphoton Inc., Tochigi (JP)

( * ) Notice: Subject to any disclaimer, the term of this patent is extended or adjusted under 35 U.S.C. 154(b) by 175 days.

(21) Appl. No.: 18/148,808

(22) Filed: Dec. 30, 2022

(65) Prior Publication Data

US 2023/0269857 A1 Aug. 24, 2023

(30) Foreign Application Priority Data

Feb. 21, 2022 (JP) ................. 2022-024854

(51) Int. Cl.
 *H05G 2/00* (2006.01)
 *G03F 7/00* (2006.01)
 *G21K 1/06* (2006.01)
(52) U.S. Cl.
 CPC ......... *H05G 2/003* (2013.01); *G03F 7/70033* (2013.01); *G21K 1/06* (2013.01); *H05G 2/008* (2013.01)
(58) Field of Classification Search
 CPC .... G03F 7/70033; H05G 2/003; H05G 2/008; H05G 2/0092
 See application file for complete search history.

(56) References Cited

U.S. PATENT DOCUMENTS

| 6,385,290 | B1 * | 5/2002 | Kondo | G03F 7/70925 |
| | | | | 378/84 |
| 2010/0149505 | A1 * | 6/2010 | Sewell | G03F 7/70208 |
| | | | | 250/559.4 |
| 2012/0313016 | A1 | 12/2012 | Fleurov et al. | |
| 2014/0146297 | A1 * | 5/2014 | Vainer | G03F 1/84 |
| | | | | 250/226 |

(Continued)

OTHER PUBLICATIONS

A Search Report issued by the Netherlands Patent Office on Mar. 18, 2025, which corresponds to Dutch Patent Application No. 2033907 and is related to U.S. Appl. No. 18/148,808; with partial English language translation.

*Primary Examiner* — Steven H Whitesell
(74) *Attorney, Agent, or Firm* — Studebaker Brackett PLLC

(57) ABSTRACT

An extreme ultraviolet light generation apparatus includes a chamber; a housing extending from an internal space of the chamber to outside of the chamber, surrounding a plasma generation region except on a trajectory of a droplet target and on an optical path of laser light, and including a first opening through which extreme ultraviolet light generated from the plasma passes; a light concentrating mirror arranged in a first space outside the housing at the internal space and reflecting the extreme ultraviolet light having passed through the first opening in a direction different from an incident direction of the extreme ultraviolet light; and a gas supply port provided in the chamber; and a gas exhaust port provided at the housing outside the chamber. An optical axis of the laser light when being radiated to the droplet target is along a direction in which the gas flows in the plasma generation region.

13 Claims, 13 Drawing Sheets

(56) References Cited

U.S. PATENT DOCUMENTS

| | | | |
|---|---|---|---|
| 2018/0084630 A1* | 3/2018 | Brandstätter | H05G 2/003 |
| 2021/0289611 A1 | 9/2021 | Ueda et al. | |
| 2021/0307150 A1* | 9/2021 | Koge | G03F 7/70033 |
| 2022/0082927 A1* | 3/2022 | Hoshino | H05G 2/008 |
| 2023/0319970 A1* | 10/2023 | Teramoto | H05G 2/003 |
| | | | 250/504 R |

* cited by examiner

EXTREME ULTRAVIOLET LIGHT GENERATION APPARATUS AND ELECTRONIC DEVICE MANUFACTURING METHOD

The present application claims the benefit of Japanese Patent Application No. 2022-024854, filed on Feb. 21, 2022, the entire contents of which are hereby incorporated by reference.

BACKGROUND

1. Technical Field

The present disclosure relates to an extreme ultraviolet light generation apparatus and an electronic device manufacturing method.

2. Related Art

Recently, miniaturization of a transfer pattern in optical lithography of a semiconductor process has been rapidly proceeding along with miniaturization of the semiconductor process. In the next generation, microfabrication at 10 nm or less will be required. Therefore, it is expected to develop a semiconductor exposure apparatus that combines an apparatus for generating extreme ultraviolet (EUV) light having a wavelength of about 13 nm with a reduced projection reflection optical system.

As the EUV light generation apparatus, a laser produced plasma (LPP) type apparatus using plasma generated by irradiating a target substance with laser light has been developed.

LIST OF DOCUMENTS

Patent Documents

Patent Document 1: US Patent Application Publication No. 2012/0313016

SUMMARY

An extreme ultraviolet light generation apparatus according to an aspect of the present disclosure may include a chamber including, at an internal space thereof, a plasma generation region in which plasma is generated from a droplet target irradiated with laser light; a housing extending from the internal space to outside of the chamber, surrounding the plasma generation region except on a trajectory of the droplet target at the internal space and on an optical path of the laser light to the plasma generation region at the internal space, and including a first opening through which extreme ultraviolet light generated from the plasma passes; a light concentrating mirror arranged in a first space outside the housing at the internal space and configured to reflect the extreme ultraviolet light having passed through the first opening in a direction different from an incident direction of the extreme ultraviolet light; a gas supply port provided in the chamber and configured to supply a gas from outside of the chamber to the first space; and a gas exhaust port provided at the housing outside the chamber and configured to exhaust the gas flowing from the first space to a second space inside of the housing through the first opening to the outside of the chamber. Here, an optical axis of the laser light when being radiated to the droplet target may be along a direction in which the gas flows in the plasma generation region.

An extreme ultraviolet light generation apparatus according to another aspect of the present disclosure may include a chamber including a plasma generation region at an internal space thereof; a target supply unit configured to supply a droplet target to the plasma generation region; a laser device configured to irradiate the droplet target with laser light so that plasma is generated from the droplet target in the plasma generation region; and a control unit. Here, the chamber may include a housing extending from the internal space to outside of the chamber, surrounding the plasma generation region except on an optical path of the laser light to the plasma generation region at the internal space, and including a first opening through which extreme ultraviolet light generated from the plasma passes and a droplet supply opening through which the droplet target supplied to the plasma generation region passes; a light concentrating mirror arranged in a first space outside the housing at the internal space and configured to reflect the extreme ultraviolet light having passed through the first opening in a direction different from an incident direction of the extreme ultraviolet light; a gas supply port provided in the chamber and configured to supply a gas from outside of the chamber to the first space; a gas exhaust port provided at the housing outside the chamber and configured to exhaust the gas flowing from the first space to a second space inside the housing through the first opening to the outside of the chamber; a target supply pipe arranged in the first space and surrounding a trajectory of the droplet target supplied from the target supply unit; a target gas supply port provided at the target supply pipe and configured to supply a gas to the plasma generation region through the target supply pipe; and a detection unit configured to detect the droplet target supplied from the target supply unit to the plasma generation region. Here, the control unit may be configured to receive a signal related to detection timing of the droplet target from the detection unit, and output a light emission trigger signal which is delayed by a predetermined time with respect to the signal to the laser device.

An electronic device manufacturing method according to an aspect of the present disclosure may include outputting extreme ultraviolet light generated using an extreme ultraviolet light generation apparatus to an exposure apparatus; and exposing a photosensitive substrate to the extreme ultraviolet light in the exposure apparatus to manufacture an electronic device. Here, the extreme ultraviolet light generation apparatus may include a chamber including, at an internal space thereof, a plasma generation region in which plasma is generated from a droplet target irradiated with laser light; a housing extending from the internal space to outside of the chamber, surrounding the plasma generation region except on a trajectory of the droplet target at the internal space, and including a first opening through which the extreme ultraviolet light generated from the plasma passes and a second opening through which the laser light passes toward the plasma generation region; a light concentrating mirror arranged at a first space outside the housing at the internal space and configured to reflect the extreme ultraviolet light having passed through the first opening in a direction different from an incident direction of the extreme ultraviolet light; a gas supply port provided in the chamber and configured to supply a gas from outside of the chamber to the first space; and a gas exhaust port provided at the housing outside the chamber and configured to exhaust the gas flowing from the first space to a second space inside of the housing through the first opening to the outside of the chamber. Here, an optical axis of the laser light when being radiated to the droplet target may be along a direction in which the gas flows in the plasma generation region.

An electronic device manufacturing method according to another aspect of the present disclosure may include inspecting a defect of a mask by irradiating the mask with extreme ultraviolet light generated using an extreme ultraviolet light generation apparatus; selecting a mask using a result of the inspection; and exposing and transferring a pattern formed on the selected mask onto a photosensitive substrate. Here, the extreme ultraviolet light generation apparatus may include a chamber including, at an internal space thereof, a plasma generation region in which plasma is generated from a droplet target irradiated with laser light; a housing extending from the internal space to outside of the chamber, surrounding the plasma generation region except on a trajectory of the droplet target at the internal space, and including a first opening through which the extreme ultraviolet light generated from the plasma passes and a second opening through which the laser light passed toward the plasma generation region; a light concentrating mirror arranged at a first space outside the housing at the internal space and configured to reflect the extreme ultraviolet light having passed through the first opening in a direction different from an incident direction of the extreme ultraviolet light; a gas supply port provided in the chamber and configured to supply a gas from outside of the chamber to the first space; and a gas exhaust port provided at the housing outside the chamber and configured to exhaust the gas flowing from the first space to a second space inside of the housing through the first opening to the outside of the chamber. Here, an optical axis of the laser light when being radiated to the droplet target may be along a direction in which the gas flows in the plasma generation region.

BRIEF DESCRIPTION OF THE DRAWINGS

Embodiments of the present disclosure will be described below merely as examples with reference to the accompanying drawings.

DESCRIPTION OF EMBODIMENTS

Figure 1:
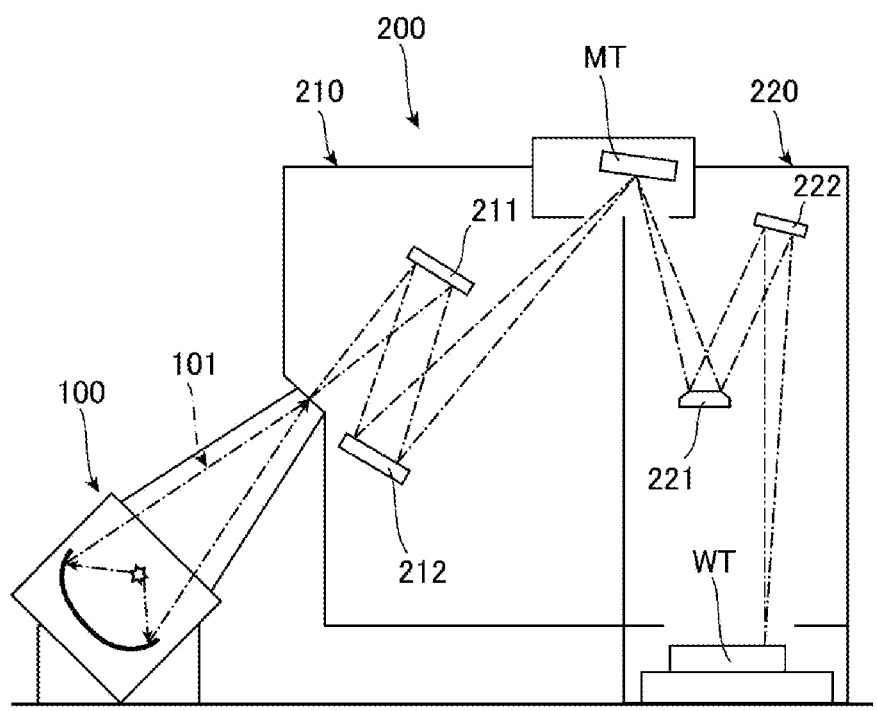
FIG. 1 is a schematic view showing a schematic configuration example of an entire electronic device manufacturing apparatus.

1. Overview
2. Description of electronic device manufacturing apparatus
3. Description of extreme ultraviolet light generation apparatus of comparative example
　3.1 Configuration
　3.2 Operation
　3.3 Problem
4. Description of extreme ultraviolet light generation apparatus of first embodiment
　4.1 Configuration
　4.2 Effect
5. Description of extreme ultraviolet light generation apparatus of second embodiment
　5.1 Configuration
　5.2 Effect
6. Description of extreme ultraviolet light generation apparatus of third embodiment
　6.1 Configuration
　6.2 Operation
　6.3 Effect
7. Description of extreme ultraviolet light generation apparatus of fourth embodiment
　7.1 Configuration
　7.2 Operation
　7.3 Effect Hereinafter, embodiments of the present disclosure will be described in detail with reference to the drawings. The embodiments described below show some examples of the present disclosure and do not limit the contents of the present disclosure. Also, all configurations and operation described in the embodiments are not necessarily essential as configurations and operation of the present disclosure. Here, the same components are denoted by the same reference numerals, and duplicate description thereof is omitted.

1. Overview

Embodiments of the present disclosure relate to an extreme ultraviolet light generation apparatus generating light having a wavelength of extreme ultraviolet (EUV) and an electronic device manufacturing apparatus. In the following, extreme ultraviolet light is referred to as EUV light in some cases.

2. Description of Electronic Device Manufacturing Apparatus

FIG. 1 is a schematic view showing a schematic configuration example of an entire electronic device manufacturing apparatus. The electronic device manufacturing apparatus shown in FIG. 1 includes an EUV light generation apparatus 100 and an exposure apparatus 200. The exposure apparatus 200 includes a mask irradiation unit 210 including a plurality of mirrors 211, 212 that constitute a reflection optical system, and a workpiece irradiation unit 220 including a plurality of mirrors 221, 222 that constitute a reflection optical system different from the reflection optical system of the mask irradiation unit 210. The mask irradiation unit 210 illuminates, via the mirrors 211, 212, a mask pattern of the mask table MT with EUV light 101 incident from the EUV light generation apparatus 100. The workpiece irradiation unit 220 images the EUV light 101 reflected by the mask table MT onto a workpiece (not shown) arranged on a workpiece table WT via the mirrors 211, 212. The workpiece is a photosensitive substrate such as a semiconductor wafer on which photoresist is applied. The exposure apparatus 200 synchronously translates the mask table MT and the workpiece table WT to expose the workpiece to the EUV light 101 reflecting the mask pattern. Through the exposure process as described above, a device pattern is transferred onto the semiconductor wafer, thereby a semiconductor device can be manufactured.

Figure 2:
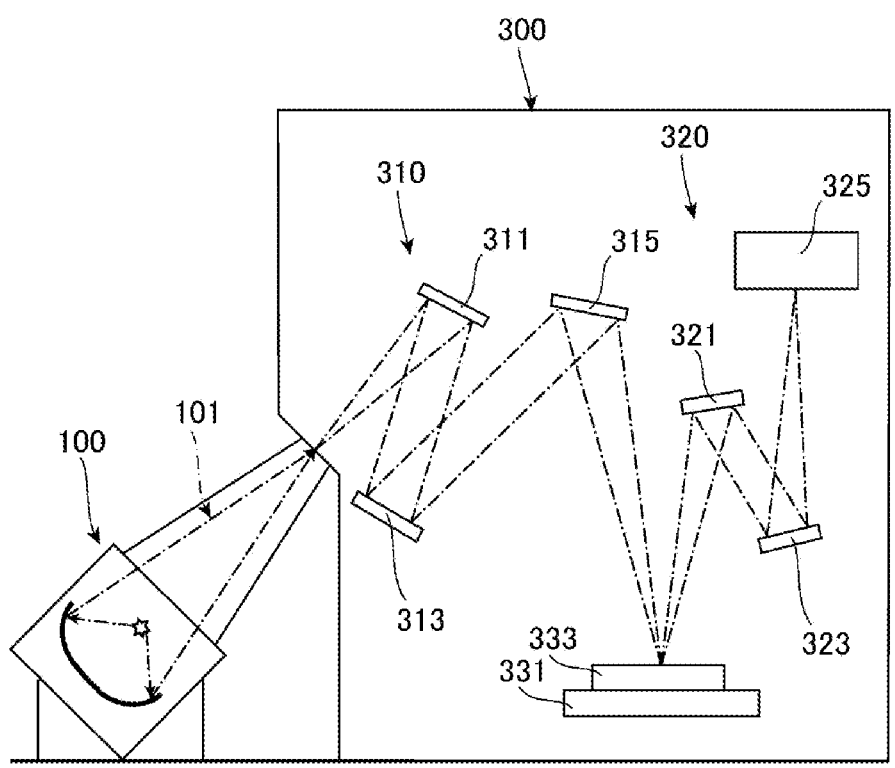
FIG. 2 is a schematic view showing a schematic configuration example of an entire electronic device manufacturing apparatus different from the electronic device manufacturing apparatus shown in FIG. 1.

FIG. 2 is a schematic view showing a schematic configuration example of an entire electronic device manufacturing apparatus different from the electronic device manufacturing apparatus shown in FIG. 1. The electronic device manufacturing apparatus shown in FIG. 2 includes the EUV light generation apparatus 100 and an inspection apparatus 300. The inspection apparatus 300 includes an illumination optical system 310 including a plurality of mirrors 311, 313, 315 that constitute a reflection optical system, and a detection optical system 320 including a detector 325 and a plurality of mirrors 321, 322 that constitute a reflection optical system different from the reflection optical system of the illumination optical system 310. The illumination optical system 310 reflects, with the mirrors 311, 313, 315, the EUV light 101 incident from the EUV light generation apparatus 100 to illuminate a mask 333 placed on a mask stage 331. The mask 333 includes a mask blanks before a pattern is formed. The detection optical system 320 reflects, with the mirrors 321, 323, the EUV light 101 reflecting the pattern from the mask 333 and forms an image on a light receiving surface of the detector 325. The detector 325 having received the EUV light 101 obtains an image of the mask 333. The detector 325 is, for example, a time delay integration (TDI) camera. A defect of the mask 333 is inspected based on the image of the mask 333 obtained by the above-described process, and a mask suitable for manufacturing an electronic device is selected using the inspection result. Then, the electronic device can be manufactured by exposing and transferring the pattern formed on the selected mask onto the photosensitive substrate using the exposure apparatus 200.

3. Description of Extreme Ultraviolet Light Generation Apparatus of Comparative Example

3.1 Configuration

The EUV light generation apparatus 100 of a comparative example will be described. The comparative example of the present disclosure is an example recognized by the applicant as known only by the applicant, and is not a publicly known example admitted by the applicant. Further, the following description will be given with reference to the EUV light generation apparatus 100 that outputs the EUV light 101 to the exposure apparatus 200 as an external apparatus as shown in FIG. 1. Here, the EUV light generation apparatus 100 that outputs the EUV light 101 to the inspection apparatus 300 as an external apparatus as shown in FIG. 2 can obtain the same operation and effect.

Figure 3:
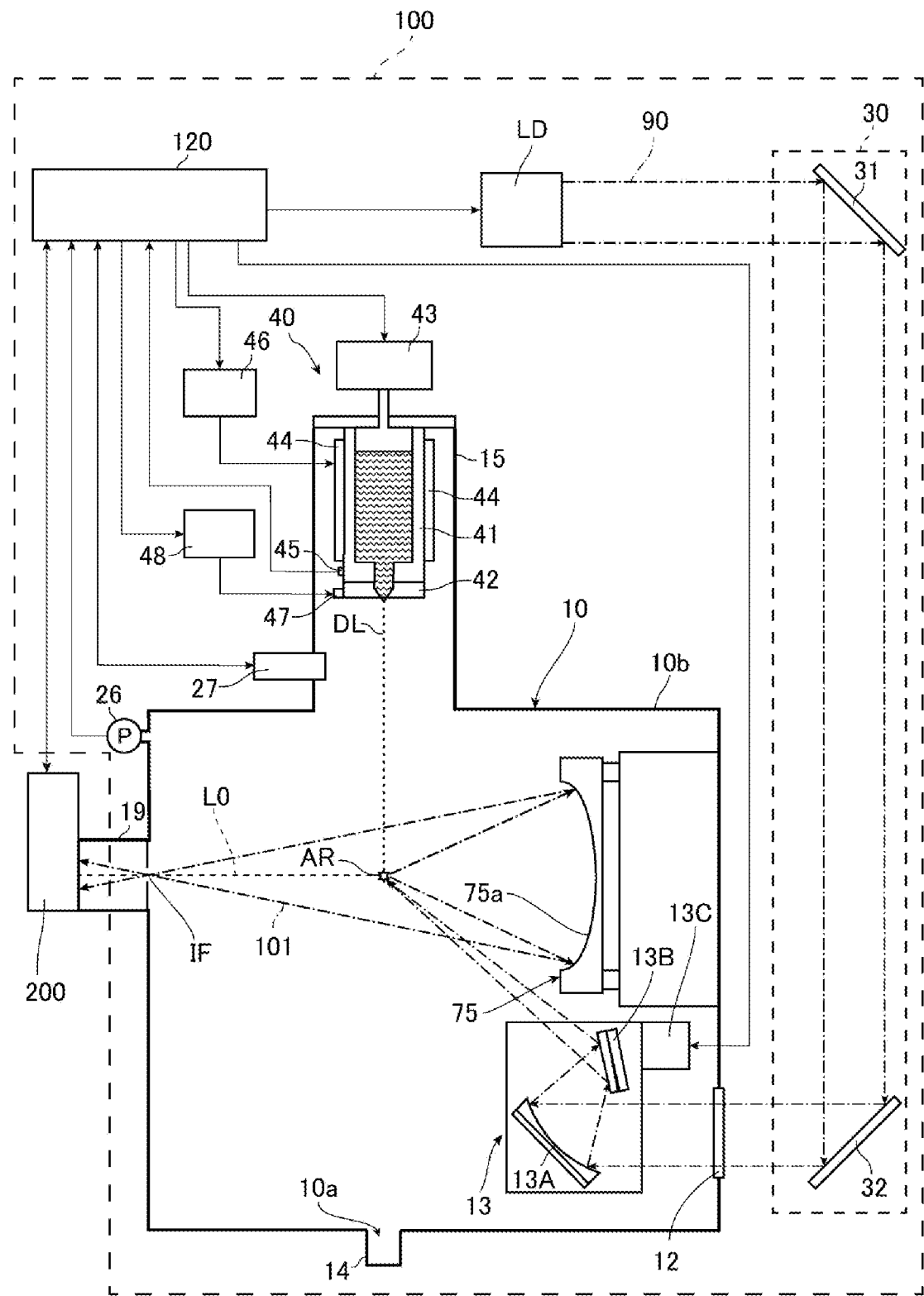
FIG. 3 is a schematic view showing a schematic configuration example of an entire extreme ultraviolet light generation apparatus of a comparative example.

FIG. 3 is a schematic view showing a schematic configuration example of the entire EUV light generation apparatus 100 of the present example. As shown in FIG. 3, the EUV light generation apparatus 100 includes a chamber 10, a laser device LD, a processor 120, and a laser light delivery optical system 30 as a main configuration.

The chamber 10 is a sealable container. The chamber 10 includes an inner wall 10b surrounding the internal space having a low pressure atmosphere. Further, the chamber 10 includes a sub-chamber 15, and a target supply unit 40 is attached to the sub-chamber 15 to penetrate a wall of the sub-chamber 15. The target supply unit 40 includes a tank 41, a nozzle 42, and a pressure regulator 43 to supply a droplet target DL to the internal space of the chamber 10. The droplet target DL is sometimes abbreviated as a droplet or target.

The tank 41 stores therein a target substance which becomes the droplet target DL. The target substance contains tin. The inside of the tank 41 is in communication with the pressure regulator 43 which regulates the pressure in the tank 41. A heater 44 and a temperature sensor 45 are attached to the tank 41. The heater 44 heats the tank 41 with current applied from a heater power source 46. Through the heating, the target substance in the tank 41 melts. The temperature sensor 45 measures, via the tank 41, the temperature of the target substance in the tank 41. The pressure regulator 43, the temperature sensor 45, and the heater power source 46 are electrically connected to the processor 120.

The nozzle 42 is attached to the tank 41 and outputs the target substance. A piezoelectric element 47 is attached to the nozzle 42. The piezoelectric element 47 is electrically connected to a piezoelectric power source 48 and is driven by voltage applied from the piezoelectric power source 48. The piezoelectric power source 48 is electrically connected to the processor 120. The target substance output from the nozzle 42 is formed into the droplet target DL through operation of the piezoelectric element 47.

The chamber 10 includes a target collection unit 14. The target collection unit 14 is a box body attached to an inner wall 10b of the chamber 10 and communicates with the internal space of the chamber 10 via an opening 10a formed at the inner wall 10b of the chamber 10. The opening 10a is arranged directly below the nozzle 42. The target collection unit 14 is a drain tank to collect any unnecessary droplet target DL having passed through the opening 10a and reaching the target collection unit 14.

At least one through hole is formed in the inner wall 10b of the chamber 10. The through hole is blocked by a window 12 through which pulse laser light 90 output from the laser device LD passes.

Further, a laser light concentrating optical system 13 is arranged at the internal space of the chamber 10. The laser light concentrating optical system 13 includes a laser light concentrating mirror 13A and a high reflection mirror 13B. The laser light concentrating mirror 13A reflects and concentrates the laser light 90 having passed through the window 12. The high reflection mirror 13B reflects the laser light 90 concentrated by the laser light concentrating mirror 13A. Positions of the laser light concentrating mirror 13A and the high reflection mirror 13B are adjusted by a laser light manipulator 13C so that a concentration position of the laser light 90 at the internal space of the chamber 10 coincides with a position specified by the processor 120. The concentration position is adjusted to be a position directly below the nozzle 42, and when the target substance is irradiated with the laser light 90 at the concentration position, plasma is generated by the irradiation, and the EUV light 101 is radiated from the plasma. The region in which plasma is generated is sometimes referred to as a plasma generation region AR. The plasma generation region AR is a region having a radius of, for example, 40 mm about the plasma point and is located at the internal space of the chamber 10.

For example, an EUV light concentrating mirror 75 having a spheroidal reflection surface 75a is arranged at the internal space of the chamber 10. The EUV light concentrating mirror 75 is provided at a position not overlapping with the laser light 90 at the internal space of the chamber 10. The reflection surface 75a reflects the EUV light 101 radiated from the plasma in the plasma generation region AR. The reflection surface 75a has a first focal point and a second focal point. The reflection surface 75a may be arranged such that, for example, the first focal point is located in the plasma generation region AR and the second focal point is located at an intermediate focal point IF. In FIG. 3, a straight line passing through the first focal point and the second focal point is shown as a focal line LO.

Further, the EUV light generation apparatus 100 includes a connection portion 19 providing communication between the internal space of the chamber 10 and the internal space of the exposure apparatus 200. A wall in which an aperture is formed is arranged inside the connection portion 19. The wall is preferably arranged such that the aperture is located at the second focal point. The connection portion 19 is an outlet port of the EUV light 101 in the EUV light generation apparatus 100, and the EUV light 101 is output from the connection portion 19 and enters the exposure apparatus 200.

Further, the EUV light generation apparatus 100 includes a pressure sensor 26 and a detection unit 27 as a target sensor. The pressure sensor 26 and the detection unit 27 are attached to the chamber 10 and are electrically connected to the processor 120. The pressure sensor 26 measures the pressure at the internal space of the chamber 10 and outputs a signal indicating the pressure to the processor 120.

The detection unit 27 has, for example, an imaging function, and detects the presence, trajectory, position, velocity, and the like of the droplet target DL output from the nozzle hole of the nozzle 42 in accordance with an instruction from the processor 120. The detection unit 27 may be arranged inside the chamber 10, or may be arranged outside the chamber 10 and detect the droplet target DL through a window (not shown) arranged on a wall of the chamber 10. The detection unit 27 includes a light receiving optical system (not shown) and an imaging unit (not shown) such as a charge-coupled device (CCD) or a photodiode. In order to improve the detection accuracy of the droplet target DL, the light receiving optical system forms an image of the trajectory of the droplet target DL and the periphery thereof on a light receiving surface of the imaging unit. When the droplet target DL passes through a light concentration region of a light source (not shown) of the detection unit 27 arranged to improve contrast in the field of view of the detection unit 27, the imaging unit detects a change of the light passing through the trajectory of the droplet target DL and the periphery thereof. The imaging unit converts the detected light change into an electric signal as a signal related to the image data of the droplet target DL. The imaging unit outputs the electric signal to the processor 120.

The laser device LD includes a master oscillator being a light source to perform burst operation. The master oscillator outputs the pulse laser light 90 in a burst-on duration. The master oscillator is, for example, a laser device configured to output the laser light 90 by exciting, through electric discharge, a gas as mixture of a carbon dioxide gas with helium, nitrogen, or the like. Alternatively, the master oscillator may be a quantum cascade laser device. The master oscillator may output the pulse laser light 90 by a Q switch system. Further, the master oscillator may include an optical switch, a polarizer, and the like. In the burst operation, the pulse laser light 90 is continuously output at a predetermined repetition frequency in the burst-on duration and the output of the laser light 90 is stopped in a burst-off duration.

A travel direction of the laser light 90 output from the laser device LD is adjusted by the laser light delivery optical system 30. The laser light delivery optical system 30 includes a plurality of mirrors 31, 32 for adjusting the travel direction of the laser light 90. The position of at least one of the mirrors 31, 32 is adjusted by an actuator (not shown). Owing to that the position of at least one of the mirrors 31, 32 is adjusted, the laser light 90 can appropriately propagate to the internal space of the chamber 10 through the window 12.

The processor 120 of the present disclosure is a processing device including a storage device in which a control program is stored and a central processing unit (CPU) that executes the control program. The processor 120 is specifically configured or programmed to perform various processes included in the present disclosure and controls the entire EUV light generation apparatus 100. The processor 120 receives a signal related to the pressure at the internal space of the chamber 10, which is measured by the pressure sensor 26, a signal related to image data of the droplet target DL captured by the detection unit 27, a burst signal instructing the burst operation from the exposure apparatus 200, and the like. The processor 120 processes the various signals, and may control, for example, the timing at which the droplet target DL is output, the output direction of the droplet target DL, and the like. Further, the processor 120 may control the emission timing of the laser device LD, the travel direction and the concentration position of the laser light 90, and the like. Such various kinds of control described above are merely exemplary, and other control may be added as necessary, as described later.

Figure 4:
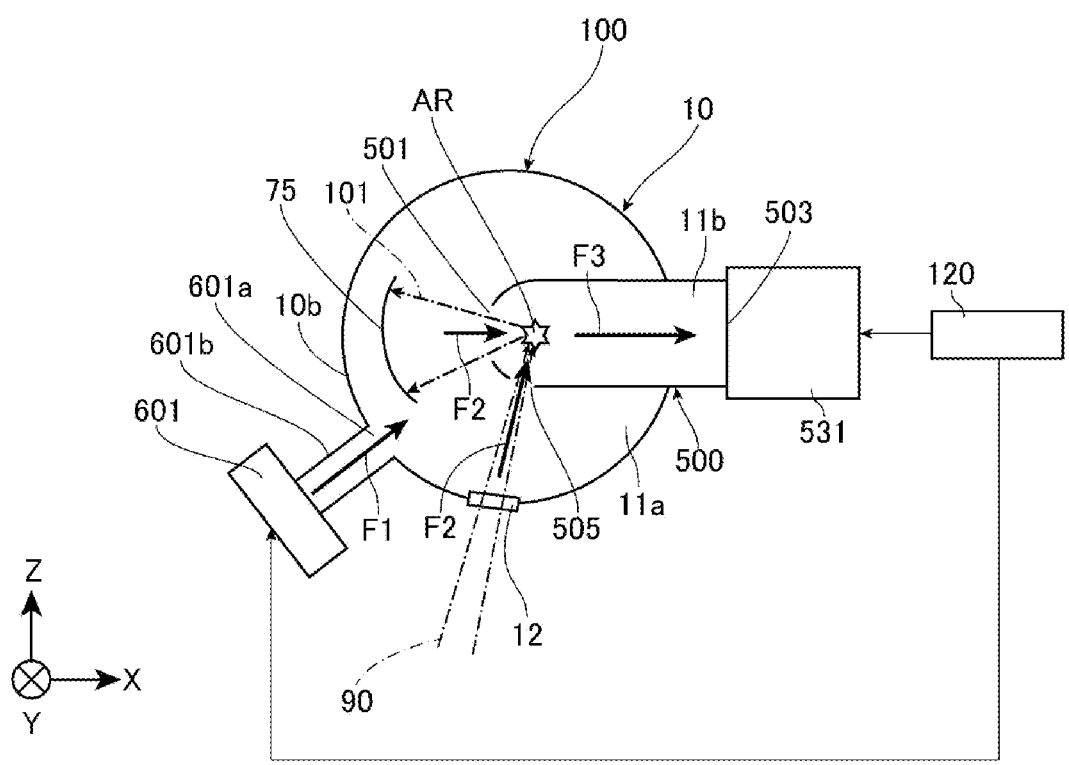
FIG. 4 is a sectional view of a chamber perpendicular to the trajectory of a droplet target in the comparative example.
Figure 5:
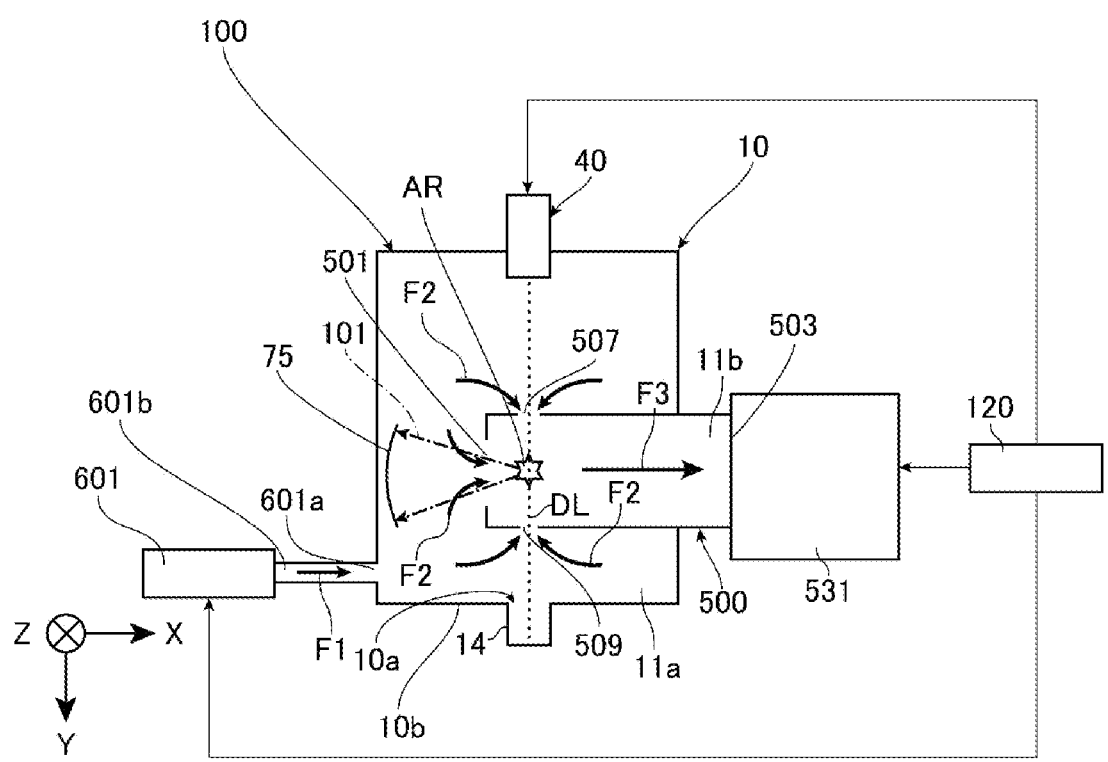
FIG. 5 is a sectional view perpendicular to the optical axis of laser light when being radiated to the droplet target.

FIG. 4 is a sectional view of the chamber 10 perpendicular to the trajectory of the droplet target DL in the comparative example, and FIG. 5 is a sectional view perpendicular to the optical axis of the laser light 90 when being radiated to the droplet target DL. In FIG. 4, for simplification of illustration, the laser light concentrating mirror 13A and the high reflection mirror 13B are omitted, and a travel path of the laser light 90 from the window 12 to the plasma generation region AR is shown in a simple manner.

The EUV light generation apparatus 100 includes a housing 500 arranged at the internal space of the chamber 10. In FIGS. 4 and 5, a space outside the housing 500 at the internal space of the chamber 10 is indicated as a first space 11a, and a space inside the housing 500 is indicated as a second space 11b. In FIG. 3, the housing 500 is not shown.

The housing 500 is made of, for example, stainless steel or metal molybdenum. The housing 500 surrounds the plasma generation region AR. That is, the plasma generation region AR is located in the second space 11b. The housing 500 linearly extends from the internal space of the chamber 10 to the external space of the chamber 10 through the inner wall 10b of the chamber 10. A first opening 501 is provided at one end of the housing 500 located at the internal space of the chamber 10, and a gas exhaust port 503 is provided at the other end of the housing 500 located outside the chamber 10.

The EUV light 101 generated from the plasma in the plasma generation region AR passes through the first opening 501 from the second space 11b toward the first space 11a. Then, the EUV light 101 travels to the EUV light concentrating mirror 75 provided in the first space 11a. The EUV light concentrating mirror 75 reflects the EUV light 101 toward the intermediate focal point IF located in a direction different from the incident direction of the EUV light 101. In FIGS. 4 and 5, for clarity of illustration, the EUV light 101 reflected by the EUV light concentrating mirror 75 is not shown. The first opening 501 faces the gas exhaust port 503, and the plasma generation region AR is located between the first opening 501 and the gas exhaust port 503. The gas exhaust port 503 is connected to a first exhaust device 531 including an exhaust pump.

Further, the housing 500 includes a second opening 505, a droplet supply opening 507, and a droplet discharge opening 509. The second opening 505 is provided on the optical path of the laser light 90 toward the plasma generation region AR at the inner space of the chamber 10 and faces the plasma generation region AR. The laser light 90 passes through the second opening 505 from the first space 11a toward the plasma generation region AR. The droplet supply opening 507 and the droplet discharge opening 509 are provided on the trajectory of the droplet target DL and face each other. The droplet target DL supplied from the target supply unit 40 to the plasma generation region AR passes through the droplet supply opening 507. The droplet target DL having passed through the plasma generation region AR passes through the droplet discharge opening 509, and the droplet discharge opening 509 faces the opening 10a continuing to the target collection unit 14. Thus, the housing 500 surrounds the plasma generation region AR except on the trajectory of the droplet target DL at the internal space of the chamber 10 and on the optical path of the laser light 90 to the plasma generation region AR at the internal space.

A gas supply port 601a is provided in the inner wall 10b of the chamber 10, and a gas pipe 601b of the first gas supply device 601 is connected to the gas supply port 601a. The first gas supply device 601 and the gas pipe 601b are provided outside the chamber 10. The first gas supply device 601 is driven and controlled by the processor 120. A supply gas flow rate adjusting unit being a valve (not shown) may be provided at the gas pipe 601b. The first gas supply device 601 supplies an etching gas to the gas pipe 601b, and the gas supply port 601a to which the gas pipe 601b is connected supplies the etching gas to the first space 11a. In FIGS. 4 and 5, the flow of the etching gas in the gas pipe 601b is indicated by an arrow F1. The flow rate of the etching gas flowing into the first space 11a from the gas supply port 601a is, for example, 40 nlm or more and 60 nlm or less. Here, nlm represents the volume of the etching gas flowing per minute converted to that at 0° C. and 1 atm. The etching gas having flowed into the first space 11a flows into the second space 11b through the first opening 501, the second opening 505, the droplet supply opening 507, and the droplet discharge opening 509. In FIGS. 4 and 5, the flow of the etching gas flowing into the second space 11b from each of the above is indicated by arrows F2.

As described above, since the target substance contains tin, the etching gas is, for example, a hydrogen-containing gas having hydrogen gas concentration of 100% in effect. Alternatively, the etching gas may be, for example, a balance gas having hydrogen gas concentration of approximately 3%. The balance gas contains a nitrogen ($N_2$) gas and an argon (Ar) gas. Tin fine particles and tin charged particles are generated when the target substance is turned into plasma in the plasma generation region AR by being irradiated with the laser light 90. Tin constituting these fine particles and charged particles reacts with hydrogen contained in the etching gas supplied to the second space 11b of the chamber 10. Through the reaction with hydrogen, tin becomes stannane ($SnH_4$) gas at room temperature. Further, when the target substance is turned into plasma in the plasma generation region AR, the residual gas as an exhaust gas is generated in the second space 11b. The residual gas contains the fine particles and charged particles of tin generated through the plasma generation from the target substance, stannane generated through the reaction of the fine particles and charged particles of tin with the etching gas, and an unreacted etching gas. Some of the charged particles are neutralized in the second space 11b, and the residual gas contains the neutralized charged particles as well. The gas exhaust port 503 exhausts the etching gas having flowed from the first space 11a to the second space 11b through the first opening 501, the second opening 505, the droplet supply opening 507, and the droplet discharge opening 509 to the outside of the chamber 10 together with the residual gas. Specifically, the gas exhaust port 503 exhausts the etching gas and the residual gas to the first exhaust device 531 by suction of the first exhaust device 531. Hereinafter, the etching gas and the residual gas in the second space 11b may be simply referred to as a gas. In FIGS. 4 and 5, the flow of the gas in the second space 11b toward the first exhaust device 531 is indicated by an arrow F3.

The area of the gas exhaust port 503 is larger than the area of the first opening 501, and the area of the first opening 501 is larger than the area of each of the second opening 505, the droplet supply opening 507, and the droplet discharge opening 509. The areas of the droplet supply opening 507 and the droplet discharge opening 509 are substantially the same as each other and are larger than the area of the second opening 505.

In the following, a direction along the trajectory of the droplet target DL may be referred to as a Y direction, a direction from the plasma generation region AR toward the first exhaust device 531 and perpendicular to the Y direction may be referred to as an X direction, and a direction perpendicular to the Y direction and the X direction may be referred to as a Z direction.

3.2 Operation

Next, operation of the EUV light generation apparatus 100 of the comparative example will be described.

In the EUV light generation apparatus 100, for example, at the time of new installation or maintenance or the like, atmospheric air at the internal space of the chamber 10 is exhausted. At this time, purging and exhausting of the internal space of the chamber 10 may be repeated for exhausting atmospheric components. For example, an inert gas such as nitrogen or argon is preferably used for the purge gas. Thereafter, when the pressure at the internal space of the chamber 10 becomes equal to or lower than the predetermined pressure, the processor 120 starts introducing the etching gas from the first gas supply device 601 into the first space 11a of the chamber 10 through the gas supply port 601a. At this time, the processor 120 may control a supply gas flow rate adjusting unit (not shown) and the first exhaust device 453 so that the pressure at the internal space of the chamber 10 is maintained at a predetermined pressure.

Thereafter, the processor 120 waits until a predetermined time elapses from the start of introduction of the etching gas.

Further, the processor 120 causes the gas at the internal space of the chamber 10 to be exhausted from the gas exhaust port 503 by the first exhaust device 60, and keeps the pressure at the internal space of the chamber 10 substantially constant based on the signal indicating the pressure at the internal space of the chamber 10 measured by the pressure sensor 26.

In order to heat and maintain the target substance in the tank 41 to and at a predetermined temperature equal to or higher than the melting point, the processor 120 causes the heater power source 46 to supply current to the heater 44 to increase temperature of the heater 44. In this case, the processor 120 controls the temperature of the target substance to the predetermined temperature by adjusting a value of the current supplied from the heater power source 46 to the heater 44 based on an output from the temperature sensor 45. When the target substance is tin, the predetermined temperature is equal to or higher than 231.93° C. being the melting point of tin and, for example, is 240° C. or higher and 290° C. or lower. Thus, the preparation for outputting the droplet target DL is completed.

When the preparation is completed, the processor 120 causes the pressure regulator 43 to supply the inert gas from the gas supply source to the tank 41 and to adjust the pressure in the tank 41 so that the melted target substance is output through the nozzle hole of the nozzle 42 at a predetermined velocity. Under this pressure, the target substance is output into the first space 11a of the chamber 10 through the nozzle hole of the nozzle 42. The target substance output through the nozzle hole may be in the form of a jet. At this time, the processor 120 causes the piezoelectric power source 48 to apply voltage having a predetermined waveform to the piezoelectric element 47 to generate the droplet target DL. The piezoelectric power source 48 applies voltage so that the waveform of the voltage value becomes, for example, a sine wave, a rectangular wave, or a sawtooth wave. Vibration of the piezoelectric element 47 can propagate through the nozzle 42 to the target substance to be output through the nozzle hole of the nozzle 42. The target substance is divided at a predetermined cycle by the vibration into liquid droplet targets DL. The diameter of the droplet target DL is approximately 10 μm or more and 30 μm or less.

When the droplet target DL is discharged, the droplet target DL passes through the droplet supply opening 507 and travels to the plasma generation region AR. The detection unit 27 detects the passage timing of the droplet target DL passing through a predetermined position in the second space 11b of the chamber 10. The processor 120 outputs the trigger signal to control the timing of outputting the laser light 90 from the laser device LD based on the signal from the detection unit 27 so that the droplet target DL is irradiated with the laser light 90. The trigger signal output from the processor 120 is input to the laser device LD. When the trigger signal is input, the laser device LD outputs the laser light 90.

The output laser light 90 is incident on the laser light concentrating optical system 13 through the laser light delivery optical system 30 and the window 12. Further, the laser light 90 travels from the laser light concentrating optical system 13 toward the plasma generation region AR through the second opening 505. Then, the droplet target DL is irradiated with the laser light 90 in the plasma generation region AR. At this time, the processor 120 controls the laser light manipulator 13C of the laser light concentrating optical system 13 so that the laser light 90 is concentrated in the plasma generation region AR. The processor 120 controls the timing of outputting the laser light 90 from the laser device LD based on the signal from the detection unit 27 so that the droplet target DL is irradiated with the laser light 90. Thus, the droplet target DL is irradiated in the plasma generation region AR with the laser light 90 concentrated by the laser light concentrating mirror 13A. Plasma is generated by the irradiation, and light including EUV light 101 is radiated from the plasma.

Among the light including the EUV light 101 generated in the plasma generation region AR, the EUV light 101 travels to the EUV light concentrating mirror 75 after passing through the first opening 501, is concentrated at the intermediate focal point IF by the EUV light concentrating mirror 75, and then, enters the exposure apparatus 200 from the connection portion 19.

As described above, the first gas supply device 601 supplies the etching gas to the first space 11a of the chamber 10 through the gas pipe 601b and the gas supply port 601a. The etching gas flows into the second space 11b through the first opening 501, the second opening 505, the droplet supply opening 507, and the droplet discharge opening 509. The first exhaust device 531 suctions the etching gas together with the residual gas in the second space 11b through the gas exhaust port 503. Accordingly, the gas in the second space 11b is exhausted to the outside of the chamber 10. By such gas exhausting, the pressure in the second space 11b becomes lower than the pressure in the first space 11a. Therefore, the etching gas in the first space 11a easily flows into the second space 11b from the first space 11a through the first opening 501, the second opening 505, the droplet supply opening 507, and the droplet discharge opening 509. When the etching gas easily flows into the second space 11b, stagnation of the etching gas in the first space 11a is suppressed, and deposition of debris such as unreacted target material which is not turned into plasma on the EUV light concentrating mirror 75 is suppressed. In addition, the backflow of the gas from the second space 11b to the first space 11a is suppressed. The gas suctioned by the first exhaust device 531 is subjected to predetermined exhaust treatment such as detoxification.

3.3 Problem

Figure 6:
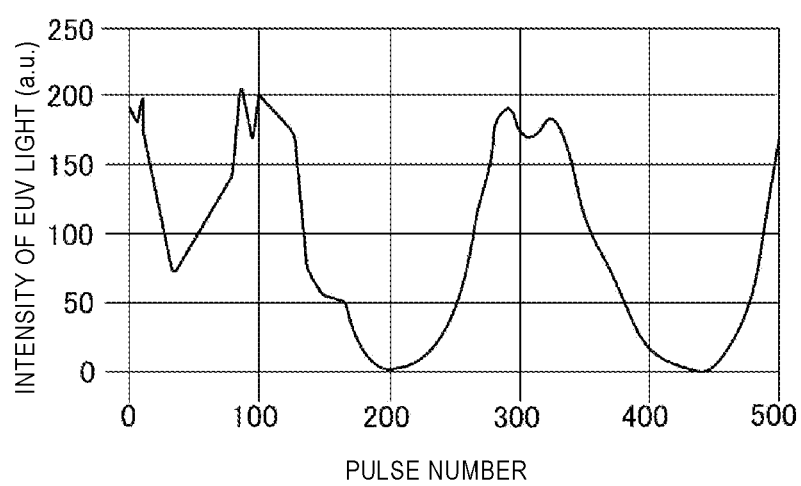
FIG. 6 is a diagram showing a change in the intensity of EUV light generated immediately after the droplet target with the irradiation position of the laser light being shifted is irradiated with the laser light.

The plasma generation region AR is located in the second space 11b of the housing 500, and the gas flows in the X direction toward the first exhaust device 531 in the second space 11b by suction of the first exhaust device 531. Accordingly, the droplet target DL to be irradiated with the laser light 90 tends to be shifted in the X direction in which the gas flows due to the flow of the gas in the second space 11b. The position of the nozzle 42 for discharging the droplet target DL is adjusted so that the droplet target DL can be irradiated with the laser light 90 in the plasma generation region AR. In this state, when the droplet target DL is irradiated with the laser light 90, the droplet target DL is heated and turned into plasma. As a result, the gas around the plasma generation region AR is also heated and expanded, and the pressure wave propagates outward in a range having a radius of, for example, about 40 mm about the plasma generation region AR. The distribution of the gas flow in the second space 11b changes with time, and the amount by which the droplet target DL passing through the second space SL is shifted in the X direction by the gas flow also changes with time. When the shift amount of the droplet target DL changes with time, the irradiation position of the laser light 90 with respect to the droplet target DL is shifted, and the intensity of the EUV light 101 generated from the droplet target DL irradiated with the laser light 90 may not be stabilized. The droplet target DL tends to be shifted in the X direction by the flow of the gas from the first opening 501 and in the Y direction by the flow of the gas from the droplet supply opening 507 and the droplet discharge opening 509. Further, the droplet target DL tends to be shifted in the travel direction of the laser light 90 at the internal space of the chamber 10 by the flow of the gas from the second opening 505. Here, since the area of the first opening 501 is larger than the area of each of the second opening 505, the droplet supply opening 507, and the droplet discharge opening 509, the droplet target DL tends to be shifted more in the X direction than in the other directions. FIG. 6 is a diagram showing a change in the intensity of the EUV light 101 generated immediately after the droplet target DL with the irradiation position of the laser light 90 being shifted as described above is irradiated with the laser light 90. In FIG. 6, the horizontal axis represents the number of pulses of the laser light 90, and the vertical axis represents the intensity of the EUV light 101. When the irradiation position of the laser light 90 with respect to the droplet target DL is shifted, the intensity of the EUV light 101 may not be stabilized even when irradiation of each droplet target DL with the laser light 90 is continued. If the intensity of the EUV light 101 is not stabilized, the EUV light 101 that satisfies the performance required by the exposure apparatus 200 or the inspection apparatus 300 is not output, and the reliability of the EUV light generation apparatus 100 may decrease.

Therefore, in each of the following embodiments, an EUV light generation apparatus 100 capable of suppressing a decrease in reliability will be exemplified.

4. Description of Extreme Ultraviolet Light Generation Apparatus of First Embodiment Next, the configuration of the EUV light generation apparatus 100 of a first embodiment will be described. Any component same as that described above is denoted by an identical reference sign, and duplicate description thereof is omitted unless specific description is needed.

4.1 Configuration

Figure 7:
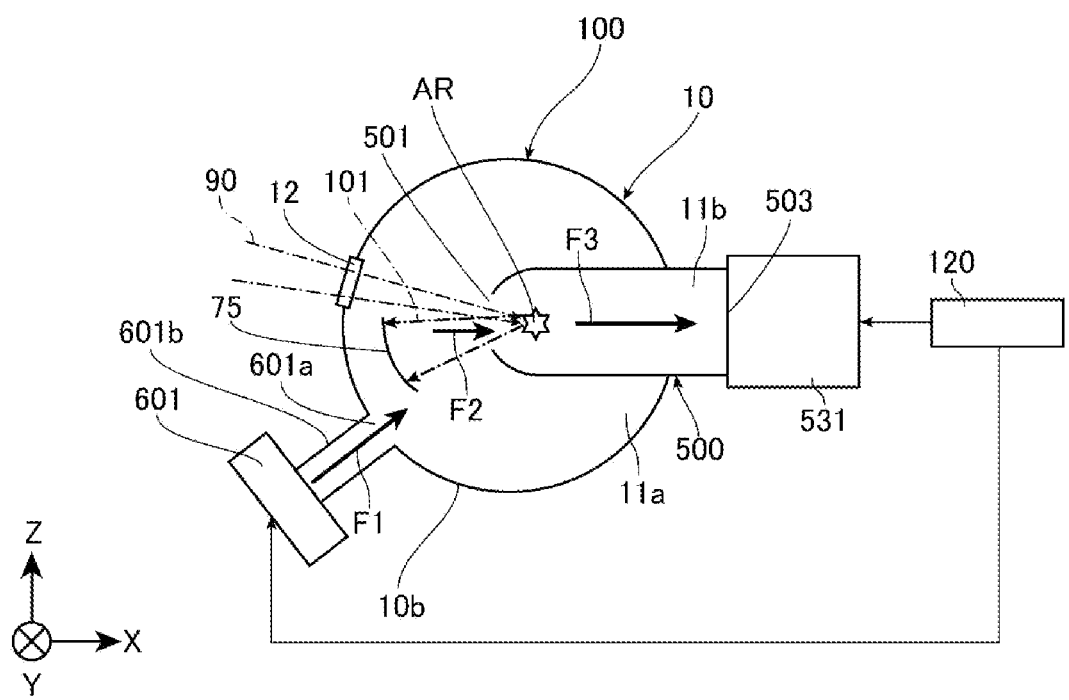
FIG. 7 is a sectional view of the chamber perpendicular to the trajectory of the droplet target in a first embodiment.

FIG. 7 is a sectional view of the chamber 10 perpendicular to the trajectory of the droplet target DL in the present embodiment. In the EUV light generation apparatus 100 of the present embodiment, the configuration of the housing 500 is different from the housing 500 of the comparative example, and the direction along the optical axis of the laser light 90 when being radiated to the droplet target DL is different from that in the comparative example. In the comparative example, the direction along the optical axis of the laser light 90 when being radiated to the droplet target DL coincides with the Z direction. Similarly to the comparative example, the direction in which the gas flows in the plasma generation region AR in the present embodiment coincides with the X direction.

The housing 500 of the present embodiment is not provided with the second opening 505. Therefore, the laser light 90 of the present embodiment passes through the side of the EUV light concentrating mirror 75 in the first space 11a, and travels from the first opening 501 to the plasma generation region AR. Further, in the present embodiment, the laser light 90 travels to the plasma generation region AR such that the optical axis of the laser light 90 when being radiated to the droplet target DL is along the direction in which the gas flows in the plasma generation region AR. The inclination angle of the optical axis of the laser light 90 when being radiated to the droplet target DL with respect to the direction in which the gas flows in the plasma generation region AR is preferably within, for example, 20 degrees.

4.2 Effect

In the chamber 10 of the present embodiment, the optical axis of the laser light 90 when being radiated to the droplet target DL is along the direction in which the gas flows in the plasma generation region AR.

When the gas flows in the second space 11b in the X direction, the droplet target DL tends to shift in the X direction in the plasma generation region AR, and the amount of shift in the X direction of the droplet target DL changes with time due to the influence of laser irradiation. According to this configuration, even when the droplet target DL to be irradiated with the laser light 90 is shifted in the direction in which the gas flows in the plasma generation region AR, the droplet target DL is located on the optical axis of the laser light 90 to be radiated to the droplet target DL. Therefore, the shift of the irradiation position of the laser light 90 with respect to the droplet target DL can be suppressed. Owing to the suppression of the shift, the intensity of the EUV light 101 generated from the droplet target DL irradiated with the laser light 90 can be stabilized. Therefore, the EUV light 101 that satisfies the performance required by the exposure apparatus 200 or the inspection apparatus 300 can be output, and a decrease in reliability of the EUV light generation apparatus 100 can be suppressed.

Further, the laser light 90 travels from the first opening 501 to the plasma generation region AR. According to this configuration, since most of the gas flowing from the first opening 501 to the second space 11b travels in the X direction, the optical axis of the laser light 90 when being radiated to the droplet target DL can be easily set to be along the direction in which the gas flows in the plasma generation region AR.

5. Description of Extreme Ultraviolet Light Generation Apparatus of Second Embodiment Next, the configuration of the EUV light generation apparatus 100 of a second embodiment will be described. Any component same as that described above is denoted by an identical reference sign, and duplicate description thereof is omitted unless specific description is needed.

5.1 Configuration

Figure 8:
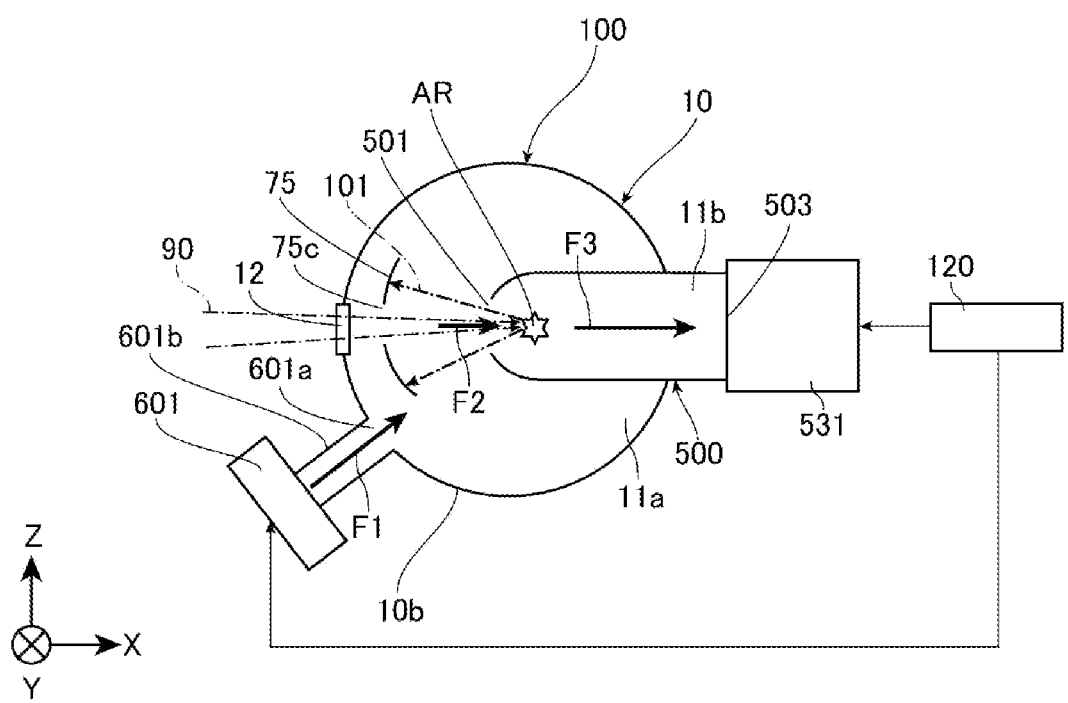
FIG. 8 is a sectional view of the chamber perpendicular to the trajectory of the droplet target in a second embodiment.

FIG. 8 is a sectional view of the chamber 10 perpendicular to the trajectory of the droplet target DL in the present embodiment. In the EUV light generation apparatus 100 of the present embodiment, the configuration of the EUV light concentrating mirror 75 and the passage position of the laser light 90 with respect to the EUV light concentrating mirror 75 are different from the first embodiment.

The EUV light concentrating mirror 75 of the present embodiment includes a mirror opening 75c through which the laser light 90 traveling to the first opening 501 passes. The mirror opening 75c is arranged at the center of the EUV light concentrating mirror 75 and faces the first opening 501. Therefore, the laser light 90 passes through the center of the EUV light concentrating mirror 75. Here, the mirror opening 75c may be arranged anywhere in the EUV light concentrating mirror 75 as long as the mirror opening 75c faces the first opening 501. The area of the mirror opening 75c is smaller than the area of the first opening 501, but may be equal to or larger than the area of the first opening 501.

5.2 Effect

The EUV light concentrating mirror 75 of the present embodiment includes the mirror opening 75c. According to this configuration, since the laser light 90 travels through the mirror opening 75c and the first opening 501 to the plasma generation region AR, the freedom of arrangement of devices arranged at the internal space of the chamber 10 such as the EUV light concentrating mirror 75 and the housing 500 can be improved. Further, the mirror opening 75c faces the first opening 501. According to this configuration, the optical axis of the laser light 90 when being radiated to the droplet target DL can be easily set to be along the direction in which the gas flows in the plasma generation region AR. Here, the mirror opening 75c may not face the first opening 501 as long as the optical axis of the laser light 90 radiated to the droplet target DL is set along the direction in which the gas flows in the plasma generation region AR.

6. Description of Extreme Ultraviolet Light Generation Apparatus of Third Embodiment Next, the configuration of the EUV light generation apparatus 100 of a third embodiment will be described. Any component same as that described above is denoted by an identical reference sign, and duplicate description thereof is omitted unless specific description is needed.

6.1 Configuration

Figure 9:
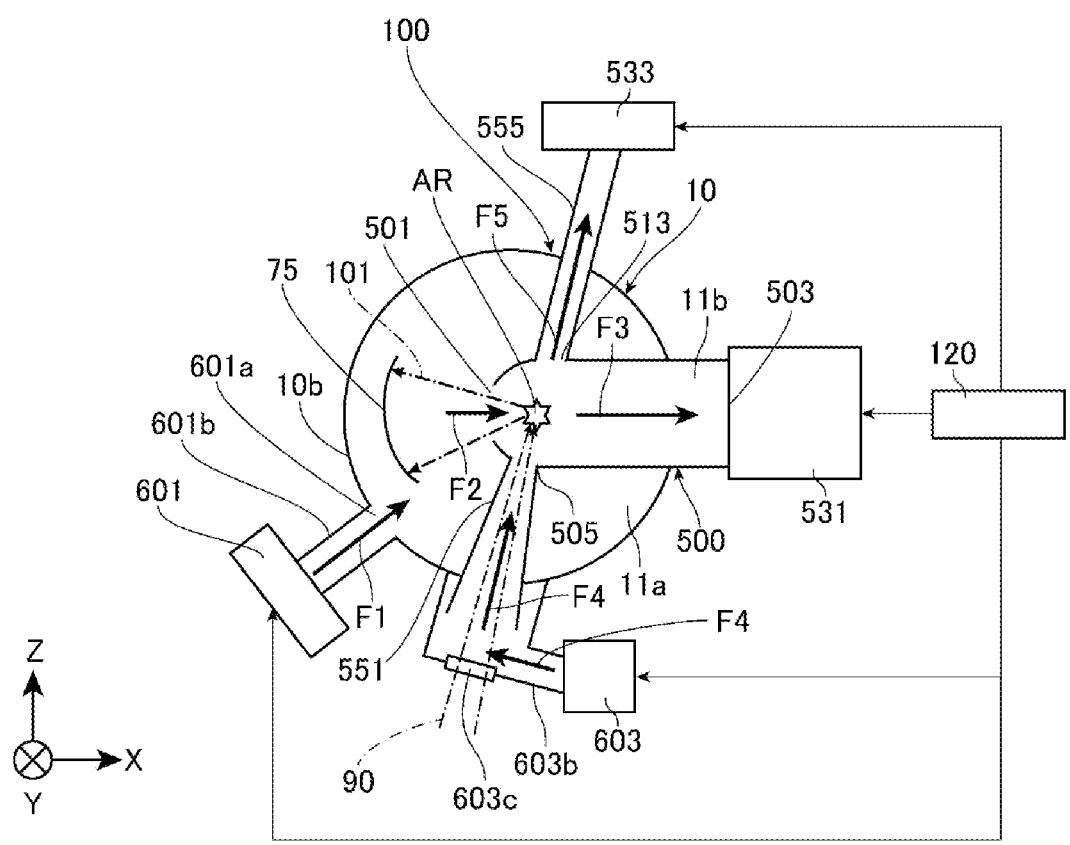
FIG. 9 is a sectional view of the chamber perpendicular to the trajectory of the droplet target in a third embodiment.

FIG. 9 is a sectional view of the chamber 10 perpendicular to the trajectory of the droplet target DL in the present embodiment. In the EUV light generation apparatus 100 of the present embodiment, the configuration of the EUV light generation apparatus 100 is different from that of the comparative example.

The EUV light generation apparatus 100 of the present embodiment further includes a first pipe 551 surrounding the optical path of the laser light 90 in the first space 11a, a first gas passage port 513 facing the second opening 505 and provided at the housing 500, and a second pipe 555 connected to the first gas passage port 513.

The first pipe 551 extends from the first space 11a to the outside of the chamber 10 and is located inside a gas pipe 603b at the outside of the chamber 10. The gas pipe 603b is connected to the outer wall of the chamber 10, and the gas pipe 603b is provided with a window 603c through which the laser light 90 passing through the inside of the first pipe 551 is transmitted. The gas pipe 603b is connected to a second gas supply device 603 outside the chamber 10. The second gas supply device 603 supplies gas to the first pipe 551 through the gas pipe 603b. This gas is an etching gas. The second gas supply device 603 is driven and controlled by the processor 120. A supply gas flow rate adjusting unit being a valve (not shown) may be provided at the gas pipe 603b. In FIG. 9, the flow of the gas in the gas pipe 603b and the first pipe 551 is indicated by arrows F4. The flow rate of the gas flowing into the first pipe 551 is, for example, 40 nlm or more 60 nlm or less.

Further, the first pipe 551 extends toward the second opening 505 in the first space 11a. The first pipe 551 is connected to the second opening 505. The first pipe 551 extending as described above supplies the gas flowing from the second gas supply device 603 through the gas pipe 603b to the plasma generation region AR through the second opening 505. The tip of the first pipe 551 located on the plasma generation region AR side in the second space 11b is located, for example, 20 mm or more away from the plasma generation region AR. The first pipe 551 may be gradually tapered toward the plasma generation region AR. The first pipe 551 does not need to be connected to the second opening 505, and the tip of the first pipe 551 may face the second opening 505 in the first space 11a.

A first flow velocity in the plasma generation region AR of the gas traveling from the first pipe 551 to the plasma generation region AR is higher than a second flow velocity in the plasma generation region AR of the gas traveling from the first space 11a through the first opening 501 to the plasma generation region AR. The first flow velocity is, for example, 200 m/s or more and 600 m/s or less, and is preferably 400 m/s. Further, the second flow velocity is, for example, 40 m/s or more and 80 m/s or less, and is preferably 60 m/s.

The first gas passage port 513 is arranged on the side opposite to the second opening 505 with respect to the plasma generation region AR. The area of the first gas passage port 513 is preferably equal to or larger than the area of the second opening 505, but may be smaller than the area of the second opening 505.

The second pipe 555 extends from the first space 11a to the outside of the chamber 10. Further, the second pipe 555 is connected to a second exhaust device 533 arranged outside the chamber 10. The second exhaust device 533 includes a suction pump. In the present embodiment, the second exhaust device 533 may not be provided and the second pipe 555 may be connected to the first exhaust device 531.

6.2 Operation

Next, operation of the EUV light generation apparatus 100 of the present embodiment will be described.

The second gas supply device 603 supplies the gas to the first pipe 551 through the gas pipe 603b. The gas flows through the first pipe 551, and flows from the first pipe 551 toward the plasma generation region AR. Therefore, unlike the first embodiment, the gas in the plasma generation region AR flows more easily in the extending direction of the first pipe 551 than the X direction. Most of the gas passes through the plasma generation region AR and the first gas passage port 513, and then flows through the second pipe 555. The gas having flowed through the second pipe 555 is exhausted to the second exhaust device 533 by suction of the second exhaust device 533. In FIG. 9, the flow of the gas in the second pipe 555 is indicated by an arrow F5. Another part of the gas flows in the X direction similarly to the first embodiment, and is exhausted to the first exhaust device 531 by suction of the first exhaust device 531.

The laser light 90 travels through the first pipe 551 to the plasma generation region AR. In the EUV light generation apparatus 100, the optical axis of the laser light 90 when being radiated to the droplet target DL is along the direction in which the gas flows in the plasma generation region AR, that is, along the extending direction of the first pipe 551. Therefore, even when the droplet target DL to be irradiated with the laser light 90 passing through the first pipe 551 is shifted in the direction in which the gas flows in the plasma generation region AR, the droplet target DL is located on the optical axis of the laser light 90. Thus, the shift of the irradiation position of the laser light 90 with respect to the droplet target DL can be suppressed. Then, when the droplet target DL is irradiated with the laser light 90, plasma is generated and the EUV light 101 is emitted from the plasma. The EUV light 101 travels through the first opening 501 to the EUV light concentrating mirror 75, is reflected by the EUV light concentrating mirror 75 in a direction different from the incident direction thereon, and travels to the exposure apparatus 200.

6.3 Effect

The EUV light generation apparatus 100 of the present embodiment further includes the first pipe 551 surrounding the optical path in the first space 11a. The first pipe 551 extends toward the second opening 505 and supplies the gas from the outside of the chamber 10 to the plasma generation region AR. According to this configuration, the optical axis of the laser light 90 can be easily set to be along the direction in which the gas flows in the plasma generation region AR. Therefore, the shift of the irradiation position of the laser light 90 with respect to the droplet target DL to which the laser light 90 is radiated can be suppressed.

The first flow velocity is higher than the second flow velocity. According to this configuration, the droplet target DL to be irradiated with the laser light 90 may be more likely to be shifted in the direction in which the gas flows from the first pipe 551 to the plasma generation region AR than in the X direction in which the gas flows from the first space 11a through the first opening 501 to the plasma generation region AR. In this configuration, the laser light 90 travels along the first pipe 551. Therefore, even when the droplet target DL is shifted in the direction in which the gas flows in the plasma generation region AR as described above, since the droplet target DL is located on the optical axis of the laser light 90, the shift of the irradiation position of the laser light 90 with respect to the droplet target DL can be suppressed. Owing to the suppression of the shift, the intensity of the EUV light 101 generated from the droplet target DL irradiated with the laser light 90 can be stabilized. Here, the first flow velocity may be equal to or lower than the second flow velocity.

Further, the EUV light generation apparatus 100 of the present embodiment further includes the first gas passage port 513 facing the second opening 505 and provided at the housing 500, and a second pipe 555 connected to the first gas passage port 513 and extending to the outside of the chamber 10. According to this configuration, the gas supplied to the plasma generation region AR through the first pipe 551 may pass through the plasma generation region AR and may be exhausted to the outside of the chamber 10 through the first gas passage port 513 and the second pipe 555. Accordingly, the gas having passed through the plasma generation region AR may be suppressed from colliding with the inner wall 10b of the housing 500, and turbulence of the flow of the gas in the plasma generation region AR due to collision can be suppressed. Therefore, the optical axis of the laser light 90 can be easily set along the direction in which the gas flows in the plasma generation region AR.

In the EUV light generation apparatus 100 of the present embodiment, the first gas passage port 513, the second pipe 555, and the second exhaust device 533 may not be provided.

Figure 10:
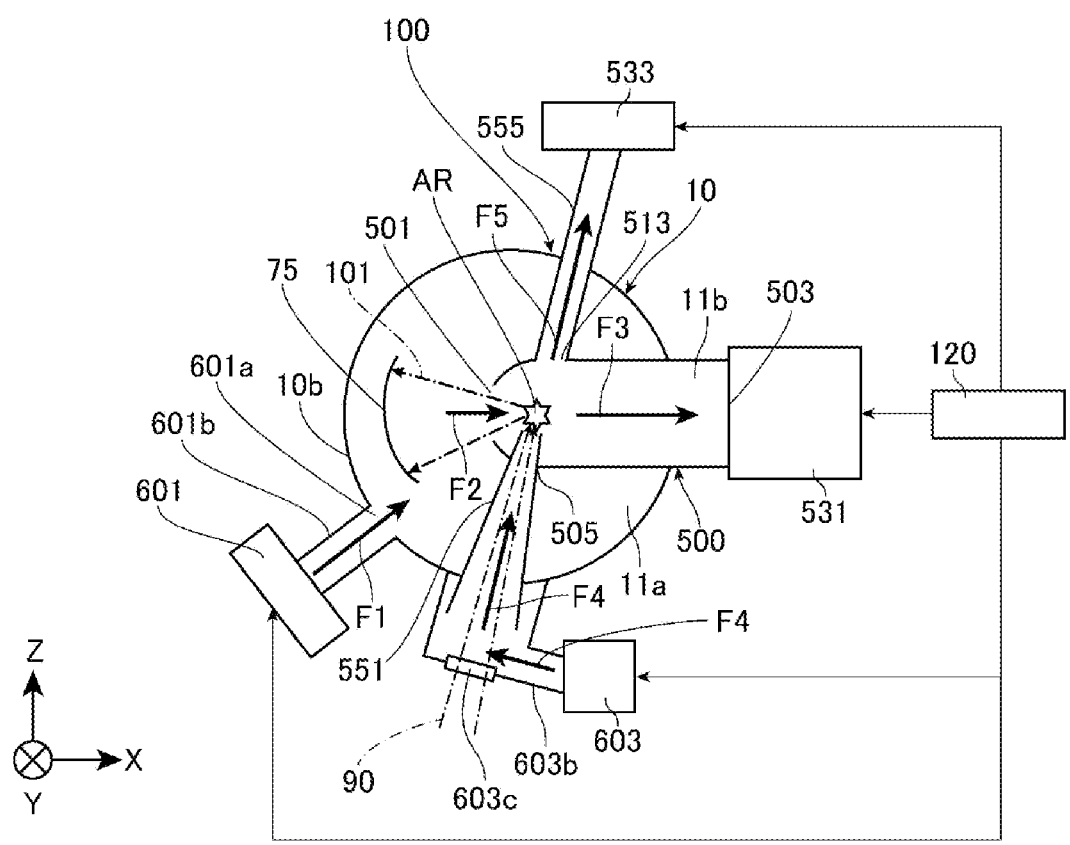
FIG. 10 is a sectional view of the chamber 10 perpendicular to the trajectory of the droplet target in a first modification of the third embodiment.

FIG. 10 is a sectional view of the chamber 10 perpendicular to the trajectory of the droplet target DL in a first modification of the present embodiment. The first pipe 551 of the present modification extends toward the plasma generation region AR in the second space 11b as passing through the second opening 505. According to this configuration, the optical axis of the laser light 90 can be further easily set to be along the direction in which the gas flows in the plasma generation region AR.

Figure 11:
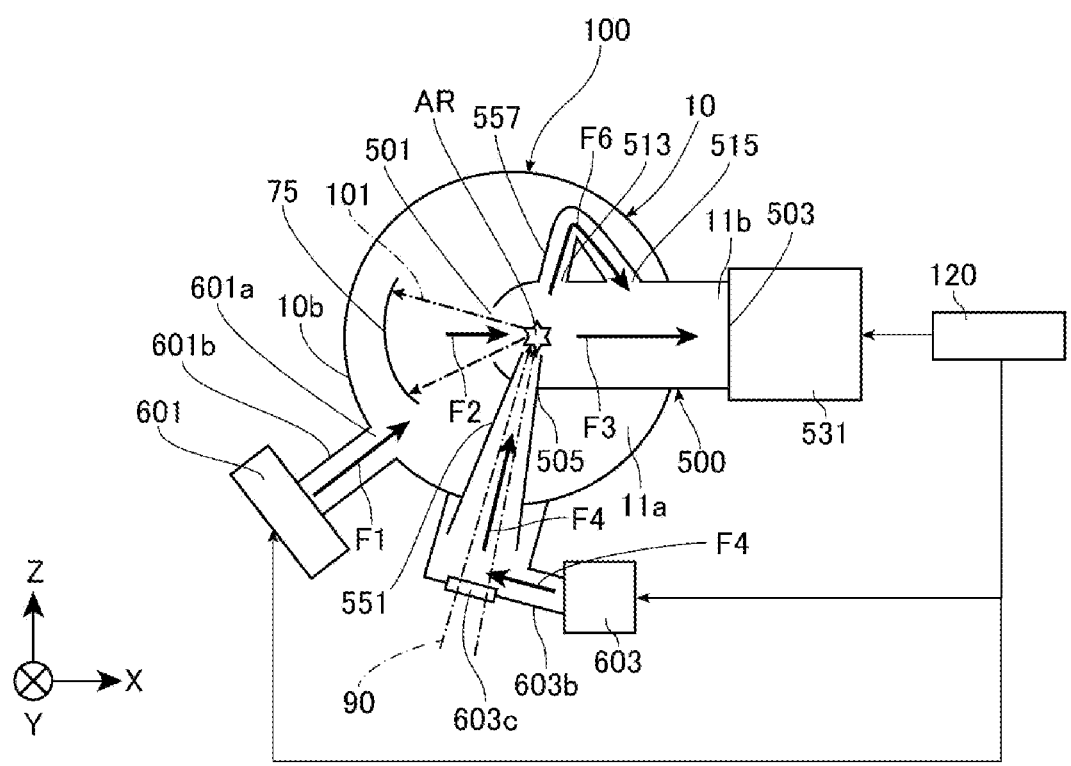
FIG. 11 is a sectional view of the chamber 10 perpendicular to the trajectory of the droplet target in a second modification of the third embodiment.

FIG. 11 is a sectional view of the chamber 10 perpendicular to the trajectory of the droplet target DL in a second modification of the present embodiment. In the EUV light generation apparatus 100 of the present modification, the second exhaust device 533 is not provided, and the configuration of the EUV light generation apparatus 100 and the housing 500 is different from that of the third embodiment.

The EUV light generation apparatus 100 of the present modification includes a second gas passage port 515 provided at the housing 500, and a third pipe 557 arranged in the first space 11a and connected to the first gas passage port 513 and the second gas passage port 515. The second gas passage port 515 is provided at the housing 500 at a position different from the first opening 501, the gas exhaust port 503, the second opening 505, the droplet supply opening 507, the droplet discharge opening 509, and the first gas passage port 513.

According to this configuration, the gas supplied to the plasma generation region AR through the first pipe 551 may pass through the plasma generation region AR and travel to the second space 11b through the first gas passage port 513, the third pipe 557, and the second gas passage port 515. In FIG. 11, the flow of the gas in the third pipe 557 is indicated by an arrow F6. The gas can then be exhausted from the gas exhaust port 503 to the outside of the chamber 10. Further, according to this configuration, an opening for extending the second pipe 555 to the outside of the chamber 10 is not required to be provided in the chamber 10, and the second exhaust device 533 can be eliminated, so that the configuration of the chamber 10 can be simplified.

The second gas passage port 515 is located between the first gas passage port 513 and the gas exhaust port 503 in the X direction. According to this configuration, the gas flowing through the third pipe 557 travels to the downstream side of the plasma generation region AR. Therefore, turbulence of the trajectory of the droplet target DL in the plasma generation region AR due to the gas having passed through the plasma generation region AR can be suppressed.

In the present modification as well, the first pipe 551 does not need to extend through the second opening 505, and may be connected to the second opening 505, or the tip of the first pipe 551 may face the second opening 505 in the first space 11a.

7. Description of Extreme Ultraviolet Light Generation Apparatus of Fourth Embodiment Next, the configuration of the EUV light generation apparatus 100 of a fourth embodiment will be described. Any component same as that described above is denoted by an identical reference sign, and duplicate description thereof is omitted unless specific description is needed.

7.1 Configuration

Figure 12:
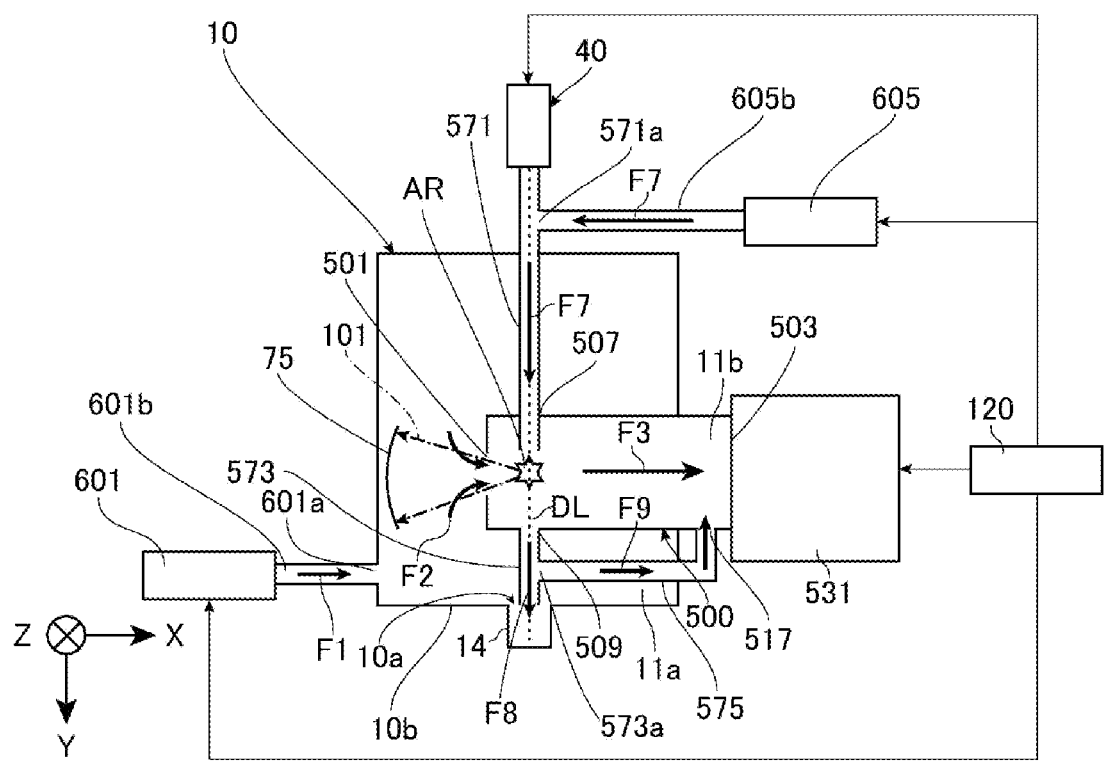
FIG. 12 is a sectional view perpendicular to the optical axis of the laser light when being radiated to the droplet target in a fourth embodiment.
Figure 13:
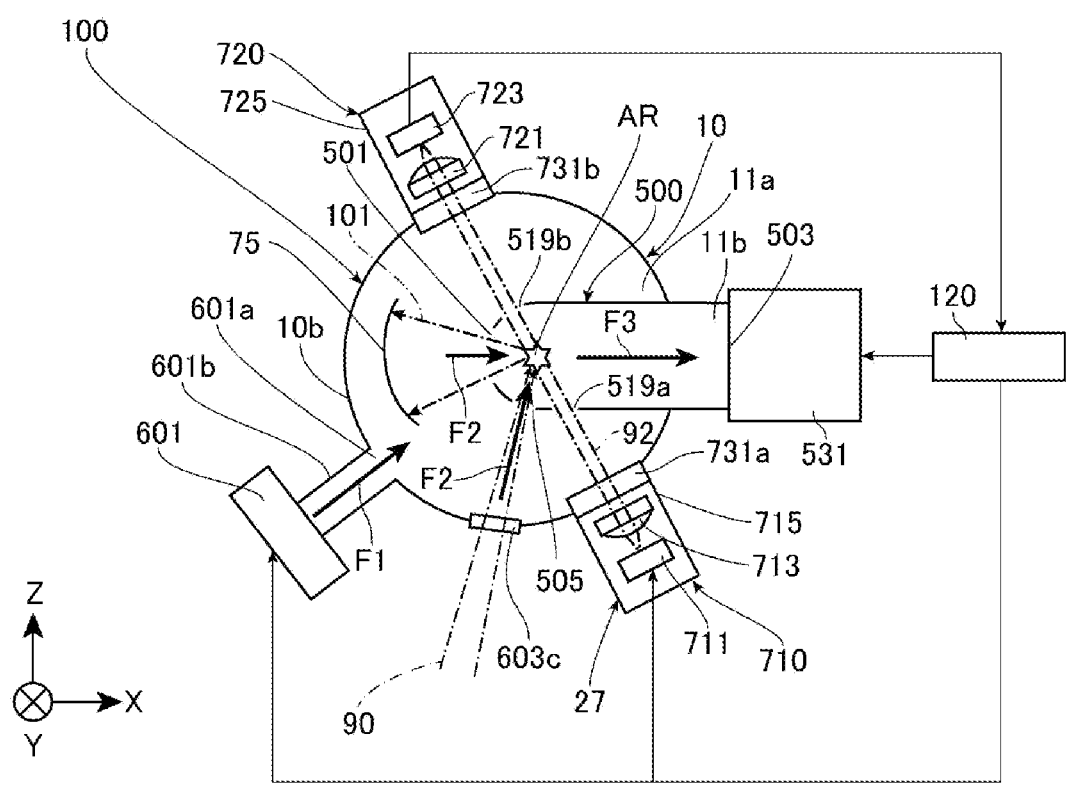
FIG. 13 is a sectional view of the chamber perpendicular to the trajectory of the droplet target in the fourth embodiment.

FIG. 12 is a sectional view perpendicular to the optical axis of the laser light 90 when being radiated to the droplet target DL in the present embodiment, and FIG. 13 is a sectional view of the chamber 10 perpendicular to the trajectory of the droplet target DL. In the EUV light generation apparatus 100 of the present embodiment, the configuration of the EUV light generation apparatus 100 is different from that of the comparative example.

The EUV light generation apparatus 100 further includes a target supply pipe 571, a target receiving pipe 573, and a gas passage pipe 575.

The target supply pipe 571 is arranged along the Y direction in the first space 11a and extends to the outside of the chamber 10. The target supply pipe 571 surrounds the trajectory of the droplet target DL supplied from the target supply unit 40 located outside the chamber 10. The target supply pipe 571 of the present embodiment extends toward the plasma generation region AR in the second space 11b as passing through the droplet supply opening 507. The tip of the target supply pipe 571 located on the plasma generation region AR side in the second space 11b is located, for example, 20 mm or more away from the plasma generation region AR.

A target gas supply port 571a is provided at the target supply pipe 571 at the outside of the chamber 10. A gas pipe 605b is connected to the target gas supply port 571a, and a third gas supply device 605 is connected to the gas pipe 605b at the outside of the chamber 10. The third gas supply device 605 supplies a gas to the target gas supply port 571a through the gas pipe 605b, and the target gas supply port 571a supplies the gas to the plasma generation region AR through the target supply pipe 571. This gas is an etching gas. The third gas supply device 605 is driven and controlled by the processor 120. A supply gas flow rate adjusting unit (not shown) being a valve may be arranged at the gas pipe 605b. In FIG. 12, the flow of the gas in the gas pipe 605b and the target supply pipe 571 is indicated by arrows F7. The flow rate of the gas flowing into the target supply pipe 571 is, for example, 40 nlm or more and 60 nlm or less.

A third flow velocity of the gas in the plasma generation region AR traveling from the target gas supply port 571a to the plasma generation region AR through the target supply pipe 571 is, for example, 200 m/s or more and 600 m/s or less, and is preferably 400 m/s. The third flow velocity is higher than the second flow velocity in the plasma generation region AR of the gas traveling from the first space 11a to the plasma generation region AR through the first opening 501.

The target receiving pipe 573 is arranged in the first space 11a, is connected to the droplet discharge opening 509, and extends along the Y direction toward the opening 10a. In this manner, the target receiving pipe 573 surrounds the trajectory of the droplet target DL having passed through the droplet discharge opening 509.

The target receiving pipe 573 is provided with a target receiving exhaust port 573a, and the gas passage pipe 575 is connected to the target receiving exhaust port 573a. The target receiving exhaust port 573a exhausts, to the gas passage pipe 575, the gas flowing from the second space 11b of the housing 500 to the target receiving pipe 573 through the droplet discharge opening 509. In FIG. 12, the flow of the gas in the target receiving pipe 573 is indicated by an arrow F8, and the flow of the gas in the gas passage pipe 575 is indicated by an arrow F9.

The gas passage pipe 575 extends to the outside of the chamber 10 and is connected to a gas passage port 517 provided at the housing 500. The gas passage port 517 is provided at the housing 500 at a position different from the first opening 501, the gas exhaust port 503, the second opening 505, the droplet supply opening 507, and the droplet discharge opening 509. The gas passage port 517 is located between the droplet discharge opening 509 and the gas exhaust port 503 in the X direction.

The detection unit 27 of the present embodiment includes a light source unit 710 for outputting light 92 toward the droplet target DL, and an imaging unit 720 for detecting the light 92 output from the light source unit 710. The light source unit 710 and the imaging unit 720 are electrically connected to the processor 120. The light source unit 710 is arranged on the side opposite to the imaging unit 720 with reference to the trajectory of the droplet target DL. That is, the light source unit 710 and the imaging unit 720 are arranged to face each other across the trajectory of the droplet target DL. Further, the direction in which the light source unit 710 and the imaging unit 720 are aligned is perpendicular to the trajectory, but may not be perpendicular to the trajectory. The light source unit 710 is attached to the inner wall 10b of the chamber 10 at the outside of the chamber 10, and is arranged coaxially with a window 731a provided in the inner wall 10b. The imaging unit 720 is also attached to the inner wall 10b of the chamber 10 and is arranged coaxially with a window 731b provided in the inner wall 10b.

The light source unit 710 includes a container 715, and a light source 711 and an illumination optical system 713 that are accommodated in the container 715. The light source 711 may be, for example, a light source that outputs monochromatic laser light or a flash lamp that outputs light including a plurality of wavelengths. The illumination optical system 713 concentrates the light 92 output from the light source 711 onto the trajectory of the droplet target DL through the window 731a and the opening 519a of the housing 500. The illumination optical system 713 includes, for example, a collimator lens.

The imaging unit 720 includes a container 725, and a light receiving optical system 721 and an imaging unit 723 that are accommodated in the container 725. The light receiving optical system 721 includes, for example, a light concentrating lens. The light receiving optical system 721 concentrates the light 92 from the second space 11b through the opening 519b of the housing 500 and the window 731b to the imaging unit 723. Specifically, in order to improve the detection accuracy of the droplet target DL, the light receiving optical system 721 forms an image of the trajectory of the droplet target DL and the periphery thereof on a light receiving surface of the imaging unit 723. When the droplet target DL passes through the concentration region of the light 92 by the light source unit 710, the imaging unit 723 detects a change in the light 92 passing through the trajectory of the droplet target DL and the periphery thereof. The imaging unit converts the detected change of the light 92 into an electric signal as a signal related to the image data of the droplet target DL. The imaging unit outputs the electric signal to the processor 120. The imaging unit 723 outputs a signal related to the detection timing of the droplet target DL to the processor 120. The processor 120 outputs a light emission trigger signal which is delayed by a predetermined time with respect to the signal related to the detection timing of the droplet target DL to the laser device LD. The imaging unit 723 is, for example, a charge-coupled device (CCD), a photodiode, or the like. The light source unit 710, the imaging unit 720, the openings 519a, 519b, and the windows 731a, 731b are provided such that the detection point of the droplet target DL by the detection unit 27 is located, for example, 2 mm away from the plasma generation region AR toward the droplet supply opening 507 in the second space 11b.

7.2 Operation

Next, operation of the EUV light generation apparatus 100 of the present embodiment will be described.

The target supply unit 40 discharges the droplet target DL, and the droplet target DL travels to the plasma generation region AR through the target supply pipe 571. The unnecessary droplet target DL passes through the plasma generation region AR and is collected by the target collection unit 14 through the droplet discharge opening 509, the target receiving pipe 573, and the opening 10a.

In this state, the light source unit 710 outputs the light 92 toward the droplet target DL, and the imaging unit 720 detects the light 92.

The third gas supply device 605 supplies the gas to the target supply pipe 571 through the gas pipe 605b and the target gas supply port 571a. The gas flows through the target supply pipe 571, and flows toward the plasma generation region AR from the target supply pipe 571. Therefore, unlike the first embodiment, the gas in the plasma generation region AR flows more easily in the extending direction of the target supply pipe 571 than the X direction. Most of the gas passes through the plasma generation region AR, the target receiving pipe 573, and the target receiving exhaust port 573a, and flows into the gas passage pipe 575. Then, the gas flowing through the gas passage pipe 575 flows through the gas passage port 517 to the second space 11b and is exhausted to the first exhaust device 531 by suction of the first exhaust device 531. A part of the gas flows in the X direction similarly to the first embodiment, and is exhausted to the first exhaust device 531 by suction of the first exhaust device 531.

In the EUV light generation apparatus 100 of the present embodiment, the travel direction of the droplet target DL supplied from the target supply unit 40 to the plasma generation region AR is along the direction in which the gas flows in the plasma generation region AR supplied from the target supply pipe 571. Since the gas flows in the Y direction toward the plasma generation region AR through the gas pipe 605b and the target supply pipe 571 from the third gas supply device 605, the droplet target DL in the plasma generation region AR tends to shift in the direction in which the gas flows. The direction in which the gas flows coincides with the Y direction.

The processor 120 receives a signal related to the detection timing of the droplet target DL from the detection unit 27, and outputs a light emission trigger signal which is delayed by a predetermined time with respect to the signal to the laser device LD. Since the detection point of the droplet target DL by the detection unit 27 is located extremely close to the plasma generation region AR, even when the droplet target DL to be irradiated with the laser light 90 is shifted in the direction in which the gas flows, the influence on the timing at which the laser light 90 reaches the plasma generation region AR is extremely small. Therefore, the shift of the irradiation position of the laser light 90 with respect to the droplet target DL is also extremely small. Then, when the droplet target DL is irradiated with the laser light 90, plasma is generated and the EUV light 101 is emitted from the plasma. The EUV light 101 travels through the first opening 501 to the EUV light concentrating mirror 75, is reflected by the EUV light concentrating mirror 75 in a direction different from the incident direction thereon, and travels to the exposure apparatus 200.

7.3 Effect

In the chamber 10 of the present embodiment, the processor 120 receives a signal related to the detection timing of the droplet target DL from the detection unit 27, and outputs a light emission trigger signal which is delayed by a predetermined time with respect to the signal to the laser device LD.

When the gas flows in the second space 11b in the Y direction, the droplet target DL in the plasma generation region AR tends to shift in the direction in which the gas flows due to the flow of the gas in the second space 11b as described above. In the EUV light generation apparatus 100 of the present embodiment, the travel direction of the droplet target DL supplied from the target supply unit 40 to the plasma generation region AR is along the direction in which the gas flows in the plasma generation region AR supplied from the target supply pipe 571. In the above configuration, the detection point of the droplet target DL by the detection unit 27 is located directly above the plasma generation region AR, and the output timing of the laser device LD is determined after the passage of the droplet target DL at the detection point by the detection unit 27 is detected. Therefore, even when the droplet target DL to be irradiated with the laser light 90 is shifted in the direction in which the gas flows, the shift of the irradiation position of the laser light 90 with respect to the droplet target DL can be suppressed. Owing to the suppression of the shift, the intensity of the EUV light 101 generated from the droplet target DL irradiated with the laser light 90 can be stabilized. Therefore, the EUV light 101 that satisfies the performance required by the exposure apparatus 200 or the inspection apparatus 300 can be output, and a decrease in reliability of the EUV light generation apparatus 100 can be suppressed.

The target supply pipe 571 extends toward the plasma generation region AR in the second space 11b as passing through the droplet supply opening 507. According to this configuration, the droplet target DL supplied from the target supply unit 40 toward the plasma generation region AR can easily travel along the direction in which the gas flows in the plasma generation region AR toward the plasma generation region AR through the target supply pipe 571. Here, the target supply pipe 571 does not need to extend through the droplet supply opening 507, and may be connected to the droplet supply opening 507. Alternatively, the tip of the target supply pipe 571 may face the droplet supply opening 507 in the first space 11a.

The third flow velocity is higher than the second flow velocity. According to this configuration, the droplet target DL irradiated with the laser light 90 in the plasma generation region AR may be more likely to be shifted in the direction in which the gas flows to the plasma generation region AR through the target supply pipe 571 than in the direction in which the gas flows from the first space 11a through the first opening 501 to the plasma generation region AR. In this configuration, the laser light 90 travels along the target supply pipe 571. Therefore, even when the droplet target DL is shifted in the direction in which the gas flows as described above, since the droplet target DL is located on the optical axis of the laser light 90, the shift of the irradiation position of the laser light 90 with respect to the droplet target DL can be suppressed. Owing to the suppression of the shift, the intensity of the EUV light 101 generated from the droplet target DL irradiated with the laser light 90 can be stabilized. Here, the third flow velocity may be equal to or lower than the second flow velocity.

The EUV light generation apparatus 100 of the present embodiment includes the droplet discharge opening 509 and the target receiving pipe 573. According to this configuration, the gas supplied to the plasma generation region AR through the target supply pipe 571 may pass through the plasma generation region AR and be exhausted to the outside of the chamber 10 through the droplet discharge opening 509 and target receiving pipe 573. Accordingly, the gas supplied to the plasma generation region AR through the target supply pipe 571 and having passed through the plasma generation region AR may be suppressed from colliding with the inner wall 10b of the housing 500, and turbulence of the flow of the gas in the plasma generation region AR due to collision can be suppressed. Therefore, the optical axis of the laser light 90 can be easily set along the direction in which the gas flows in the plasma generation region AR. Here, the target receiving pipe 573 may not be provided.

The EUV light generation apparatus 100 of the present embodiment further includes the target receiving exhaust port 573a, the gas passage port 517, and the gas passage pipe 575. According to this configuration, the gas flowing from the second space 11b to the target receiving pipe 573 can travel to the second space 11b through the target receiving exhaust port 573a, the gas passage pipe 575, and the gas passage port 517, and can be exhausted to the outside of the chamber 10 through the gas exhaust port 503. Therefore, accumulation of the gas in the target receiving pipe 573 and deposition of debris in the target receiving pipe 573 can be suppressed.

The gas passage port 517 is located between the droplet discharge opening 509 and the gas exhaust port 503. According to this configuration, the gas flowing through the target receiving pipe 573 travels to the downstream side of the plasma generation region AR. Therefore, turbulence of the trajectory of the droplet target DL in the plasma generation region AR due to the gas having passed through the plasma generation region AR can be suppressed.

In the EUV light generation apparatus 100 of the present embodiment, the target receiving pipe 573, the gas passage port 517, and the gas passage pipe 575 may not be provided. Alternatively, in the EUV light generation apparatus 100 of the present embodiment, the target receiving exhaust port 573a, the gas passage port 517, and the gas passage pipe 575 may not be provided.

The description above is intended to be illustrative and the present disclosure is not limited thereto. Therefore, it would be obvious to those skilled in the art that various modifications to the embodiments of the present disclosure would be possible without departing from the spirit and the scope of the appended claims. Further, it would be also obvious to those skilled in the art that embodiments of the present disclosure would be appropriately combined.

The terms used throughout the present specification and the appended claims should be interpreted as non-limiting terms unless clearly described. For example, terms such as "comprise", "include", "have", and "contain" should not be interpreted to be exclusive of other structural elements. Further, indefinite articles "a/an" described in the present specification and the appended claims should be interpreted to mean "at least one" or "one or more." Further, "at least one of A, B, and C" should be interpreted to mean any of A, B, C, A+B, A+C, B+C, and A+B+C as well as to include combinations of the any thereof and any other than A, B, and C.

What is claimed is:

1. An extreme ultraviolet light generation apparatus, comprising:
    a chamber including, at an internal space thereof, a plasma generation region in which plasma is generated from a droplet target irradiated with laser light;
    a housing extending from the internal space to outside of the chamber, surrounding the plasma generation region except on a trajectory of the droplet target at the internal space and on an optical path of the laser light to the plasma generation region at the internal space, and including a first opening through which extreme ultraviolet light generated from the plasma passes;
    a light concentrating mirror arranged in a first space outside the housing at the internal space and configured to reflect the extreme ultraviolet light having passed through the first opening in a direction different from an incident direction of the extreme ultraviolet light;
    a gas supply port provided in the chamber and configured to supply a gas from outside of the chamber to the first space; and
    a gas exhaust port provided at the housing outside the chamber and configured to exhaust the gas flowing from the first space to a second space inside of the housing through the first opening to the outside of the chamber,
    an optical axis of the laser light when being radiated to the droplet target being along a direction in which the gas flows in the plasma generation region,
    the extreme ultraviolet light generation apparatus further comprising a first pipe that surrounds the optical path of the laser light in the first space and extends to the outside of the chamber,
    wherein the first pipe extends toward a second opening at the housing through which the laser light passes from the first space toward the plasma generation region, and supplies a gas from the outside of the chamber through the second opening to the plasma generation region, and
    wherein a first flow velocity in the plasma generation region of the gas traveling from the first pipe to the plasma generation region is higher than a second flow velocity in the plasma generation region of the gas traveling from the first space through the first opening to the plasma generation region.

2. The extreme ultraviolet light generation apparatus according to claim 1,
    wherein an inclination angle of the optical axis of the laser light when being radiated to the droplet target with respect to the direction in which the gas flows in the plasma generation region is within 20 degrees.

3. The extreme ultraviolet light generation apparatus according to claim 1,
    wherein the first flow velocity is 200 m/s or higher and 600 m/s or lower.

4. The extreme ultraviolet light generation apparatus according to claim 1,
    wherein the second flow velocity is 40 m/s or higher and 80 m/s or lower.

5. The extreme ultraviolet light generation apparatus according to claim 1, further comprising:
    a first gas passage port provided at the housing and facing the second opening; and
    a second pipe connected to the first gas passage port and extending from the first space to the outside of the chamber.

6. The extreme ultraviolet light generation apparatus according to claim 1,
    wherein the first pipe further extends toward the plasma generation region in the second space as passing through the second opening.

7. The extreme ultraviolet light generation apparatus according to claim 1, further comprising:
    a first gas passage port provided at the housing and facing the second opening;

a second gas passage port provided at the housing at a position different from the first opening, the second opening, the gas exhaust port, and the first gas passage port; and a third pipe arranged in the first space and connected to the first gas passage port and the second gas passage port.

8. The extreme ultraviolet light generation apparatus according to claim 7,
wherein the second gas passage opening is located between the gas exhaust port and the first gas passage opening.

9. The extreme ultraviolet light generation apparatus according to claim 1,
wherein the first opening faces the gas exhaust port, and the plasma generation region is located between the first opening and the gas exhaust port.

10. The extreme ultraviolet light generation apparatus according to claim 1, further comprising:
a first gas passage port is arranged on the housing on a side opposite to the second opening with respect to the plasma generation region;
a first exhaust device that exhausts gas from the gas exhaust port; and
a second exhaust device that exhausts gas from the first gas passage port.

11. The extreme ultraviolet light generation apparatus according to claim 1,
wherein the first pipe is gradually tapered toward the plasma generation region.

12. An electronic device manufacturing method, comprising:
outputting extreme ultraviolet light generated using an extreme ultraviolet light generation apparatus to an exposure apparatus; and
exposing a photosensitive substrate to the extreme ultraviolet light in the exposure apparatus to manufacture an electronic device,
the extreme ultraviolet light generation apparatus including:
a chamber including, at an internal space thereof, a plasma generation region in which plasma is generated from a droplet target irradiated with laser light;
a housing extending from the internal space to outside of the chamber, surrounding the plasma generation region except on a trajectory of the droplet target at the internal space, and including a first opening through which the extreme ultraviolet light generated from the plasma passes and a second opening through which the laser light passes toward the plasma generation region;
a light concentrating mirror arranged at a first space outside the housing at the internal space and configured to reflect the extreme ultraviolet light having passed through the first opening in a direction different from an incident direction of the extreme ultraviolet light;
a gas supply port provided in the chamber and configured to supply a gas from outside of the chamber to the first space; and
a gas exhaust port provided at the housing outside the chamber and configured to exhaust the gas flowing from the first space to a second space inside of the housing through the first opening to the outside of the chamber,
an optical axis of the laser light when being radiated to the droplet target being along a direction in which the gas flows in the plasma generation region,
the extreme ultraviolet light generation apparatus further comprising a first pipe that surrounds an optical path of the laser light in the first space and extends to the outside of the chamber,
wherein the first pipe extends toward a second opening at the housing through which the laser light passes from the first space toward the plasma generation region, and supplies a gas from the outside of the chamber through the second opening to the plasma generation region, and
wherein a first flow velocity in the plasma generation region of the gas traveling from the first pipe to the plasma generation region is higher than a second flow velocity in the plasma generation region of the gas traveling from the first space through the first opening to the plasma generation region.

13. An electronic device manufacturing method, comprising:
inspecting a defect of a mask by irradiating the mask with extreme ultraviolet light generated using an extreme ultraviolet light generation apparatus;
selecting a mask using a result of the inspection; and
exposing and transferring a pattern formed on the selected mask onto a photosensitive substrate,
the extreme ultraviolet light generation apparatus including:
a chamber including, at an internal space thereof, a plasma generation region in which plasma is generated from a droplet target irradiated with laser light;
a housing extending from the internal space to outside of the chamber, surrounding the plasma generation region except on a trajectory of the droplet target at the internal space, and including a first opening through which the extreme ultraviolet light generated from the plasma passes and a second opening through which the laser light passed toward the plasma generation region;
a light concentrating mirror arranged at a first space outside the housing at the internal space and configured to reflect the extreme ultraviolet light having passed through the first opening in a direction different from an incident direction of the extreme ultraviolet light;
a gas supply port provided in the chamber and configured to supply a gas from outside of the chamber to the first space; and
a gas exhaust port provided at the housing outside the chamber and configured to exhaust the gas flowing from the first space to a second space inside of the housing through the first opening to the outside of the chamber,
an optical axis of the laser light when being radiated to the droplet target being along a direction in which the gas flows in the plasma generation region,
the extreme ultraviolet light generation apparatus further comprising a first pipe that surrounds an optical path of the laser light in the first space and extends to the outside of the chamber,
wherein the first pipe extends toward a second opening at the housing through which the laser light passes from the first space toward the plasma generation region, and supplies a gas from the outside of the chamber through the second opening to the plasma generation region, and
wherein a first flow velocity in the plasma generation region of the gas traveling from the first pipe to the plasma generation region is higher than a second flow velocity in the plasma generation region of the gas traveling from the first space through the first opening to the plasma generation region.

* * * * *